US 11,755,540 B2

(12) United States Patent
Chen et al.

(10) Patent No.: US 11,755,540 B2
(45) Date of Patent: Sep. 12, 2023

(54) CHUNKING METHOD AND APPARATUS

(71) Applicant: HUAWEI TECHNOLOGIES CO., LTD., Shenzhen (CN)

(72) Inventors: Qing Chen, Shenzhen (CN); Jun Zhou, Nanjing (CN); Yi Kai, Nanjing (CN); Qi Bu, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 156 days.

(21) Appl. No.: 17/480,675

(22) Filed: Sep. 21, 2021

(65) Prior Publication Data

US 2022/0004524 A1    Jan. 6, 2022

Related U.S. Application Data

(63) Continuation of application No. PCT/CN2020/080662, filed on Mar. 23, 2020.

(30) Foreign Application Priority Data

Mar. 22, 2019 (CN) .......................... 201910221512.3

(51) Int. Cl.
*G06F 16/174* (2019.01)
*G06F 16/14* (2019.01)

(52) U.S. Cl.
CPC ........ *G06F 16/1752* (2019.01); *G06F 16/152* (2019.01)

(58) Field of Classification Search
CPC .. G06F 16/1752; G06F 16/152; G06F 16/215; G06F 3/0608; G06F 3/0641; H03M 7/3095
See application file for complete search history.

(56) References Cited

U.S. PATENT DOCUMENTS

| 8,078,593 | B1 | 12/2011 | Ramarao |
| 2004/0128592 | A1 | 7/2004 | Park |
| 2008/0133561 | A1* | 6/2008 | Dubnicki ............. G06F 16/113 |

(Continued)

FOREIGN PATENT DOCUMENTS

| CN | 101788976 A | 7/2010 |
| CN | 102214210 A | 10/2011 |

(Continued)

OTHER PUBLICATIONS

Japanese Office Action issued in corresponding Japanese Application No. 2021-556949, dated Nov. 7, 2022, pp. 1-8.

(Continued)

*Primary Examiner* — Angelica Ruiz
(74) *Attorney, Agent, or Firm* — HAUPTMAN HAM, LLP

(57) ABSTRACT

Embodiments of this application disclose a chunking method and an apparatus for implementing the method. According to the method provided in the embodiments of this application, a first data segment of a first length may be determined starting from a header of a to-be-chunked data flow, a data distribution characteristic of the first data segment is determined based on character values of all characters in the first data segment, and then a chunking position is determined for different data distribution characteristics by using different methods. In this way, a data flow can be better chunked, so as to enhance a deduplication effect.

20 Claims, 12 Drawing Sheets

(56) References Cited

U.S. PATENT DOCUMENTS

| | | | |
|---|---|---|---|
| 2009/0070555 A1 | 3/2009 | Dvir et al. | |
| 2011/0119262 A1* | 5/2011 | Dexter | G06F 16/951 |
| | | | 707/E17.084 |
| 2017/0272209 A1* | 9/2017 | Yanovsky | G06F 12/0253 |

FOREIGN PATENT DOCUMENTS

| | | |
|---|---|---|
| CN | 103514250 A | 1/2014 |
| CN | 104050057 A | 9/2014 |
| CN | 104348571 A | 2/2015 |
| CN | 104361068 A | 2/2015 |
| CN | 104572872 A | 4/2015 |
| CN | 105022741 A | 11/2015 |
| CN | 106610794 A | 5/2017 |
| CN | 108243256 A | 7/2018 |
| JP | 2010515114 A | 5/2010 |
| KR | 20090085157 A | 8/2009 |

OTHER PUBLICATIONS

Huijun Wu et al., "One Size Does Not Fit All:The Case for Chunking Configuration in Backup Deduplication", 2018 18th IEEE/ACM International Symposium on Cluster, Cloud and Grid Computing, total:10pages.

Wen Xia et al., "FastCDC: a Fast and Efficient Content-Defined Chunking Approach for Data Deduplication", Jun. 22, 2016, total:14pages.

European Search Report issued in corresponding European Application No. 20777350.8, dated Apr. 4, 2022, pp. 1-11.

Yucheng Zhang et al, A Fast Asymmetric Extremum Content Defined Chunking Algorithm for Data Deduplication in Backup Storage Systems, IEEE Transactions on Computers (vol. 66, Issue: 2, Feb. 2017), 13 pages.

Yucheng Zhang et al, AE: An Asymmetric Extremum content defined chunking algorithm for fast and bandwidth-efficient data deduplication, 2015 IEEE Conference on Computer Communications (INFOCOM), Aug. 2015, 9 pages.

Zhou Shuangpeng, Research and Implementation of Parallel Migratory Compression Algorithm, Huazhong University of Science and Technology, 2018, Issue 01, 2 pages (abstract).

Chinese Notice of Allowance issued in corresponding Chinese Application No. 201910221512.3, dated Sep. 15, 2021, pp. 1-4.

Chinese Office Action issued in corresponding Chinese Application No. 201910221512.3, dated Mar. 1, 2021, pp. 1-25.

International Search Report issued in corresponding International Application No. PCT/CN2020/080662, dated Jul. 3, 2020, pp. 1-9.

\* cited by examiner

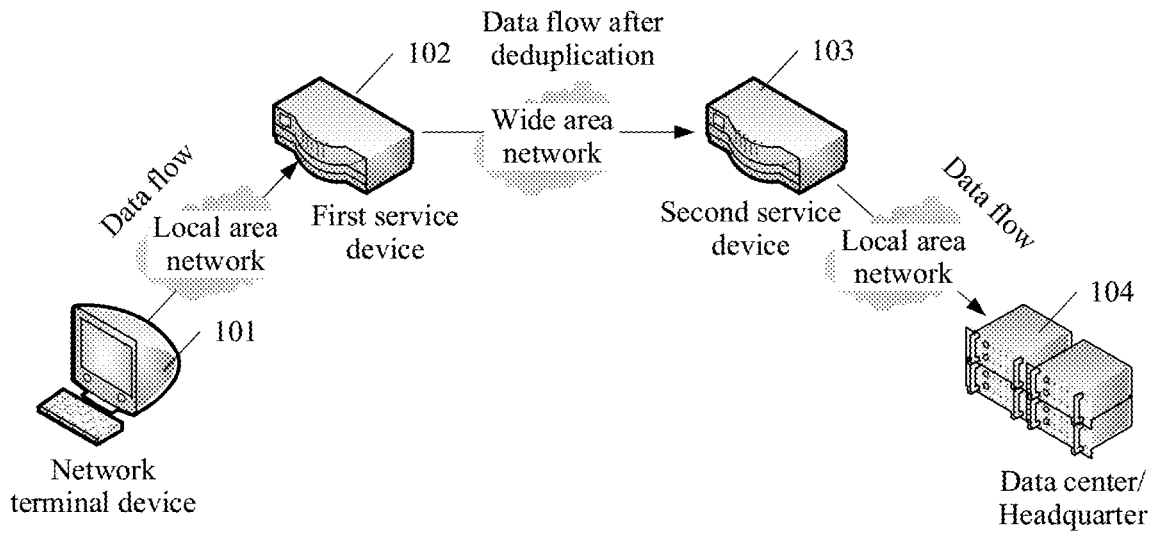

FIG. 1d

```
┌─────────────────────────────────────────────────────────┐
│   A service device determines a first data segment of a first │
│   length starting from a header of a to-be-chunked data flow,  │── S201
│   where the first data segment includes a plurality of characters, │
│   and a character length of the plurality of characters included in │
│         the first data segment is the first length           │
└─────────────────────────────────────────────────────────┘
                              │
                              ▼
┌─────────────────────────────────────────────────────────┐
│  The service device determines a data distribution characteristic │── S202
│   of the first data segment based on character values of all the │
│              characters in the first data segment              │
└─────────────────────────────────────────────────────────┘
                              │
                              ▼
┌─────────────────────────────────────────────────────────┐
│  The service device determines a chunking position of the to-  │── S203
│     be-chunked data flow based on the data distribution        │
│            characteristic of the first data segment             │
└─────────────────────────────────────────────────────────┘
                              │
                              ▼
┌─────────────────────────────────────────────────────────┐
│  The service device uses characters between a start position of a │── S204
│    first character in the first data segment and the chunking    │
│                  position as a data chunk                     │
└─────────────────────────────────────────────────────────┘
```

FIG. 2

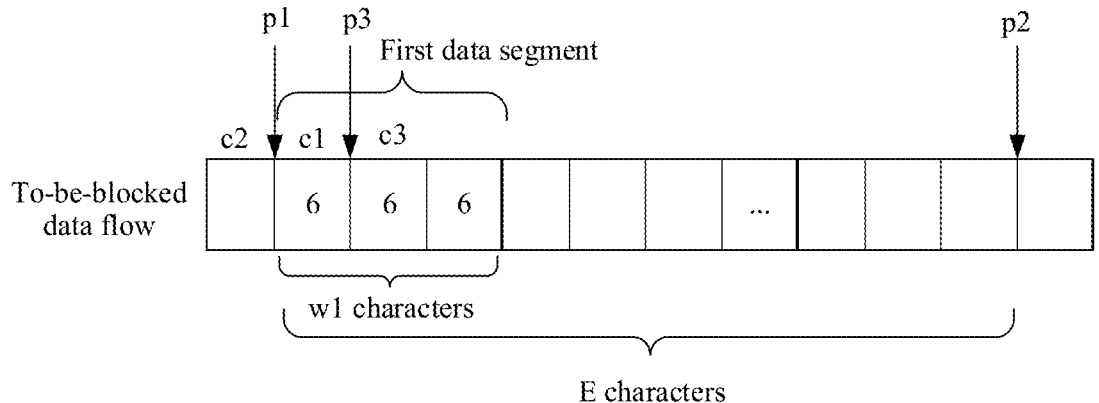

FIG. 3b

| A service device determines a first data segment of a first length starting from a header of a to-be-chunked data flow, where the first data segment includes a plurality of characters, and a character length of the plurality of characters included in the first data segment is the first length | — S401 |

| If a character value of a first character in the first data segment is a maximum value in character values of the characters in the first data segment, and the character value of the first character in the first data segment is equal to a character value of a last character in the first data segment, the service device determines that a data distribution characteristic of the first data segment is plain distribution | — S402 |

| If the data distribution characteristic of the first data segment is the plain distribution, the service device determines a chunking position of the to-be-chunked data flow based on an expected chunking length | — S403 |

| The service device uses characters between a start position of the first character in the first data segment and the chunking position as a data chunk | — S404 |

FIG. 4a

CHUNKING METHOD AND APPARATUS

CROSS-REFERENCE TO RELATED APPLICATIONS

This application is a continuation of International Application No. PCT/CN2020/080662, filed on Mar. 23, 2020, which claims priority to Chinese Patent Application No. 201910221512.3, filed on Mar. 22, 2019. The disclosures of the aforementioned applications are hereby incorporated by reference in their entireties.

TECHNICAL FIELD

This application relates to the field of data processing, and in particular, to a chunking method and apparatus.

BACKGROUND

With rapid development of networks, the aggregate data explosively increases, which poses new challenges to data storage and transmission. As a technology that can effectively eliminate redundant data, data deduplication has become a research hotspot.

Usually, the data deduplication may include four phases: data chunking, fingerprint calculation, fingerprint indexing, and storage. In the data chunking phase, a data flow is divided into small data chunks. In the fingerprint calculation phase, fingerprints of the data chunks obtained through division are calculated. Then, in the fingerprint indexing phase, duplicate data chunks are identified by matching the fingerprints of the data chunks against each other. Finally, non-duplicate data chunks are stored, and the duplicate data chunks are not repeatedly stored.

Currently, a data chunking technology mainly includes a fixed size chunking algorithm. In the fixed size chunking algorithm, a predefined chunk size is set, and all data flows are chunked based on the predefined chunk size. The fixed size chunking algorithm is affected by a boundary offset. The boundary offset means that a boundary of a data chunk is offset due to an operation such as data insertion or deletion, and therefore a duplicate data chunk is detected as a non-duplicate data chunk. For example, if one character is inserted at the beginning of an original file, and the fixed size chunking algorithm is used, boundaries of all data chunks in an edited file differ from boundaries of data chunks in the original file by one character in terms of length. Therefore, no data chunk is detected as a duplicate data chunk. It can be learned that a chunking effect of the fixed size chunking algorithm is relatively poor, affecting a deduplication effect.

SUMMARY

Embodiments of this application provide a chunking method and apparatus, so as to better chunk a data flow and enhance a deduplication effect.

According to a first aspect, an embodiment of this application provides a chunking method. The method includes: determining a first data segment of a first length starting from a header of a to-be-chunked data flow, where the first data segment includes a plurality of characters, and a character length of the plurality of characters is the first length; determining a data distribution characteristic of the first data segment based on character values of all characters in the first data segment; determining a chunking position of the to-be-chunked data flow based on the data distribution characteristic of the first data segment; and using characters between a start position of a first character in the first data segment and the chunking position as a data chunk.

In this technical solution, the data distribution characteristic of the first data segment is determined based on the character values of all characters in the first data segment, and then the chunking position is determined for different data distribution characteristics by using different methods. In this way, the chunking method provided in the embodiments of this application can better adapt to a to-be-chunked data flow that has different data distribution characteristics. In this way, the to-be-chunked data flow can be better divided, to enhance a deduplication effect.

In an implementation, a specific implementation of determining a data distribution characteristic of the first data segment based on character values of the characters in the first data segment may be: If a character value of the first character in the first data segment is a maximum value in the character values of the characters in the first data segment, and the character value of the first character in the first data segment is equal to a character value of a last character in the first data segment, determining that the data distribution characteristic of the first data segment is plain distribution.

In this technical solution, when the character value of the first character in the first data segment is the maximum character value in the character values of all the characters in the first data segment, and the character value of the first character in the first data segment is equal to the character value of the last character in the first data segment, it indicates that character values of all the characters between the first character and the last character in the first data segment are less than or equal to the maximum character value. Therefore, it may be considered that a probability that the character values of all the characters in the first data segment are equal and are all the maximum character value is relatively high, and the data distribution characteristic of the first data segment may be determined as the plain distribution. In addition, a specific implementation of determining whether the character values of all the characters in the first data segment are the same may be: first determining a maximum character value in the character values of all the characters in the first data segment; successively determining whether the character values of all the characters in the first data segment are equal to the maximum character value; and if the character values of all the characters in the first data segment are equal to the maximum character value, determining that the character values of all the characters in the first data segment are the same. In comparison with determining whether the character values of all the characters in the first data segment are the same, in this technical solution, only the maximum character value in the character values of all the characters in the first data segment are to be determined, and then, whether the character value of the first character and the character value of the last character in the first data segment are both equal to the maximum character value may be compared to determine whether the data distribution characteristic of the first data segment is the plain distribution. It can be learned that the data distribution characteristic of the first data segment can be determined more quickly by using this technical solution. Therefore, chunking efficiency of the to-be-chunked data flow is improved.

In an implementation, when the data distribution characteristic of the first data segment is the plain distribution, a specific implementation of determining the chunking position of the to-be-chunked data flow based on an expected chunking length may be: determining a first target character from characters after the last character in the first data segment, where the first target character meets a chunking condition, and the chunking condition includes: a character value of the first target character is different from the character value of the first character in the first data segment, and a character length of a data segment for which the first character in the first data segment is used as a start character and a previous character of the first target character is used as an end character is greater than or equal to the expected chunking length; and determining a start position of the first target character as the chunking position of the to-be-chunked data flow.

In this technical solution, when the data distribution characteristic of the first data segment is the plain distribution, a start position of the first target character that meets two chunking conditions is determined as the chunking position. On one hand, a length of a data chunk determined based on the chunking position may be greater than or equal to the expected chunking length, to avoid a case in which a length that is of the data chunk and that is output according to an asymmetric extremum algorithm is less than the expected chunking length when the data distribution characteristic of the first data segment is the plain distribution, so that power consumption for calculating a hash value of the data chunk can be effectively reduced. On the other hand, more characters with a same character value may be chunked into a same data chunk as much as possible, so as to improve a deduplication rate and enhance a deduplication effect.

In an implementation, when the data distribution characteristic of the first data segment is the plain distribution, a specific implementation of determining the chunking position of the to-be-chunked data flow based on an expected chunking length may be: determining a position as the chunking position of the to-be-chunked data flow, where a character length between the position and the start position of the first character in the first data segment is the expected chunking length.

In this technical solution, when it is determined that the data distribution characteristic of the first data segment is the plain distribution, there is a relatively high probability that a data distribution characteristic of a data segment (for example, a data segment whose character length is E−w1) after and adjacent to the first data segment (whose character length is w1) is also the plain distribution. Therefore, the position is determined as the chunking position of the to-be-chunked data flow, where the character length between the position and the start position of the first character in the first data segment is an expected chunking length E. On one hand, the first data segment and the data segment that is after and adjacent to the first data segment and whose character length is E−w1 that are of the plain distribution may be chunked into a same data chunk. In this way, more characters with a same character value may be chunked into the same data chunk as much as possible, so as to improve a deduplication rate and enhance a deduplication effect. On the other hand, character values of all characters in the data segment whose character length is E−w1 may not be calculated. In this way, chunking efficiency can be improved, and a throughput of a deduplication system can be improved.

In an implementation, when the data distribution characteristic of the first data segment is non-plain distribution, a specific implementation of determining the chunking position of the to-be-chunked data flow based on a second length may be: determining a second data segment from the to-be-chunked data flow, where a first character in the second data segment is adjacent to a last character in the first data segment, and a character length between an end position of the second target character and an end position of a last character in the second data segment is the second length; and if character values of all characters in the second data segment are less than a character value of a second target character, determining the end position of the last character in the second data segment as the chunking position of the to-be-chunked data flow.

In this technical solution, after it is determined that the data distribution characteristic of the first data segment is the non-plain distribution, the second data segment may be further determined from the to-be-chunked data flow, and whether the data distribution characteristic of the first data segment is plateau distribution or even distribution is further determined based on the character values of all characters in the second data segment. When the data distribution characteristic of the first data segment is the plateau distribution, in the asymmetric extremum algorithm, after a maximum value is found, an end position of a $w^{th}$ character after a character corresponding to the maximum value is determined as the chunking position of the to-be-chunked data flow, while according to the chunking method disclosed in the embodiments of this application, an end position of a $w2^{nd}$ character after the second target character (namely, a character corresponding to the maximum value) may be determined as the chunking position of the to-be-chunked data flow. In addition, w2<w. Therefore, when the data distribution characteristic of the first data segment is the plateau distribution, a character length of a data chunk output according to the chunking method disclosed in the embodiments of this application is less than a character length of a data chunk output according to the asymmetric extremum algorithm. In this way, a next chunking period can be entered as soon as possible. This effectively reduces impact of the plateau distribution on a search process of the chunking position.

According to a second aspect, an embodiment of this application provides a chunking apparatus. The apparatus has a function of implementing the chunking method provided in the first aspect. The function may be implemented by hardware, or may be implemented by hardware executing corresponding software. The hardware or the software includes one or more modules corresponding to the function.

According to a third aspect, an embodiment of this application provides a computer-readable storage medium, configured to store computer program instructions used by the partition apparatus according to the second aspect. The computer program instructions include a program used to execute the first aspect.

According to a fourth aspect, an embodiment of this application provides a service device. The service device includes a memory and a processor, the memory stores program instructions, the processor is connected to the memory through a bus, and the processor invokes the program instructions stored in the memory, so that the service device performs the method according to the first aspect.

According to a fifth aspect, an embodiment of this application provides a computer program product. The program product includes a program, and when the program is executed, the method according to the first aspect is implemented.

According to a sixth aspect, an embodiment of this application further provides a processor. The processor includes at least one circuit, configured to determine a first data segment of a first length starting from a header of a to-be-chunked data flow, determine a data distribution characteristic of the first data segment based on character values of characters in the first data segment, and determine a chunking position of the to-be-chunked data flow based on the data distribution characteristic of the first data segment. The processor further includes at least one circuit, configured to use characters between a start position of a first character in the first data segment and the chunking position as a data chunk. The processor may be a chip, and may execute instructions or a program used to implement the method in the first aspect.

According to a seventh aspect, an embodiment of this application further provides a chip system. The chip system includes a processor, for example, applied to a service device, to implement the function or the method in the first aspect. In a feasible implementation, the chip system further includes a memory. The memory is configured to store program instructions and data that are necessary for performing the function in the method in the first aspect. The chip system may include a chip, or may include a chip and another discrete component.

BRIEF DESCRIPTION OF DRAWINGS

FIG. 1d is a schematic diagram of a network architecture according to an embodiment of this application;

FIG. 2 is a schematic flowchart of a chunking method according to an embodiment of this application;

FIG. 3b is a schematic diagram of a scenario in which a chunking position of a to-be-chunked data flow is determined based on an expected chunking length according to an embodiment of this application;

FIG. 4a is a schematic flowchart of still another chunking method according to an embodiment of this application;

FIG. 7a-1, FIG. 7a-2, and FIG. 7a-3 are a schematic flowchart of still another chunking method according to an embodiment of this application;

DESCRIPTION OF EMBODIMENTS

Figure 1A:
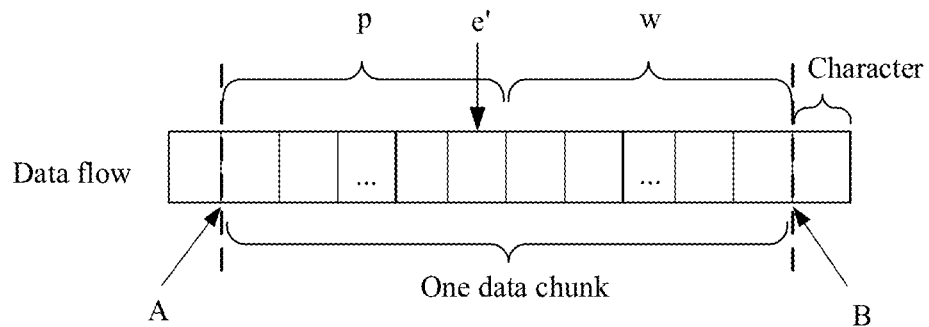
FIG. 1a is a schematic diagram of an operating principle of an existing asymmetric extremum algorithm.

The following describes terms used in the embodiments of this application.

Even distribution: If a probability that a character value of each character in a data segment is any value in a value range corresponding to the character is the same, a data distribution characteristic of the data segment is even distribution. The character in the data segment may be a single-byte character or a multi-byte character. The single-byte character is a character whose storage space occupied in a memory is one byte, and the multi-byte character is a character whose storage space occupied in the memory is a plurality of bytes. In the embodiments of this application, an example in which the character in the data segment is the single-byte character is used for description. The storage space occupied by the single-byte character in the memory is eight bits. A character value of the single-byte character is a decimal value converted from the eight-bit binary data corresponding to the single-byte character, and a value range corresponding to the single-byte character is all decimal numbers that can be represented by eight bits, that is, 0 to 255. If the character in the data segment is a double-byte character, because storage space occupied by the double-byte character in the memory is 16 bits, a character value of a character in the data segment is a decimal value converted from 16-bit binary data corresponding to the character, and a value range corresponding to the character is all decimal numbers that can be represented by 16 bits, that is, 0 to 65535.

It should be noted that, for ease of description, in the following, a value obtained by converting eight-bit binary data corresponding to each byte into decimal is referred to as a character value.

In the embodiments of this application, the data distribution characteristic of the data segment may be classified into different types based on different dimensions. For example, the data distribution characteristic of the data segment may be classified into the even distribution and non-even distribution based on whether the probability that the character value of each character in the data segment is any value in the value range corresponding to the character is the same. According to whether the character value of each character in the data segment is the same, the data distribution characteristic of the data segment may be classified into plain distribution and non-plain distribution.

Non-even distribution: If a probability that a character value of each character in a data segment is any value in a value range corresponding to the character is different, a data distribution characteristic of the data segment is the non-even distribution. The non-even distribution may include the plain distribution, the plateau distribution, and basin distribution.

Plain distribution: If character values of all characters in a data segment are the same, a data distribution characteristic of the data segment is the plain distribution.

Non-plain distribution: If at least two characters whose character values are different exist in a data segment, that is, if the character values of the characters in the data segment are not completely the same, a data distribution characteristic of the data segment is the non-plain distribution. The non-plain distribution may include the even distribution, the plateau distribution, and the basin distribution.

Plateau distribution: If there is an extremely large character value in a character value of each character in a data segment, and the extremely large character value is greater than character values of surrounding characters, a data distribution characteristic of the data segment is the plateau distribution.

Basin distribution: If there is an extremely small character value in a character value of each character in a data segment, and the extremely small character value is less than character values of surrounding characters, a data distribution characteristic of the data segment is the basin distribution.

It should be noted that data distribution characteristics of different data segments belonging to a same data flow may be the same or may be different. For example, if a data segment 1 and a data segment 2 belong to a same data flow, and a data distribution characteristic of the data segment 1 is the even distribution, a data distribution characteristic of the data segment 2 may be the plain distribution, the plateau distribution, the basin distribution, or the even distribution. This is not limited in the embodiments of this application.

Because a fixed size chunking algorithm is affected by a boundary offset problem, a variable size chunking algorithm is generated, and a length of a data chunk output according to the fixed size chunking algorithm is variable. A mainstream variable size chunking algorithm may include but is not limited to asymmetric extremum (Asymmetric Extremum, AE), exclusive OR (exclusive OR, XOR), Rabin (Rabin), sample byte (Sample Byte), TTTD (Two Thresholds, Two Divisors), and RAM (Rapid Asymmetric Maximum). The AE algorithm considers the deduplication rate and throughput. Compared with the foregoing variable size chunking algorithm, the AE algorithm has optimal deduplication performance.

A core of the AE algorithm is to find a maximum value (namely, the maximum character value) and a position of the maximum value in a data segment by comparing character values of characters, to determine a chunking position. FIG. 1a is a schematic diagram of an operating principle of an asymmetric extremum algorithm, where e' is a maximum character value in a range p+w, a length of p is variable, and a length of w is fixed; character values of all characters in a range p are less than e', and character values of all characters in a range w are less than or equal to e'; all characters in the range p+w form a data chunk (namely, a current data chunk); and a chunking position A of a previous data chunk is a start position of a first character in the range p, and a chunking position B of the current data chunk is an end position of a last character in the range w. As shown in FIG. 1a, a probability of finding the maximum value e' in the range p+w is 1/(p+w). Therefore, it can be obtained that $$\int_0^\infty \frac{1}{p+w} dp = 1,$$

to further obtain p=w(e−1), where e=2.71. A key parameter of the AE algorithm is an expected chunking length E, and E directly determines deduplication performance of the AE algorithm. The expected chunking length E is calculated according to a relational expression p=w(e−1), and a parameter w=E/(e−1) may be obtained.

As shown in FIG. 1a, starting from the chunking position A of the previous data chunk, a position of the maximum value e' in the range p+w is searched for by successively comparing the character values of the characters. After the position of the maximum value e' is found, B is used as the chunking position of the current data chunk, where B=e'+w. A specific operating procedure in which the AE algorithm performs chunk processing on a data flow into is as follows:

① traversing characters in the data flow, and finding a character a, where a character value of the character a in the data flow is greater than character values of all characters before the character a in a same data chunk;

② viewing w characters backwards from a position at which the character a is located;

③ if character values of the w characters are all less than or equal to the character value of the character a, determining that an end position of a $w^{th}$ character that is viewed backwards, starting from the position at which the character a is located, is a chunking position of a current data chunk; and ④ after the chunking position of the current data chunk is determined, repeating the step ① until all data in the data flow is chunked.

Because the AE algorithm includes a process of searching for a maximum value, a boundary offset problem can be effectively resolved. However, a theoretical model of the AE algorithm is established based on that a data distribution characteristic of the data segment is the even distribution. Therefore, a chunking effect is not ideal when the data distribution characteristic of the data segment is the non-even distribution.

The following analyzes disadvantages of the AE algorithm based on two cases in which the data distribution characteristic of the data segment is the plain distribution and the plateau distribution in the non-even distribution.

Figure 1B:
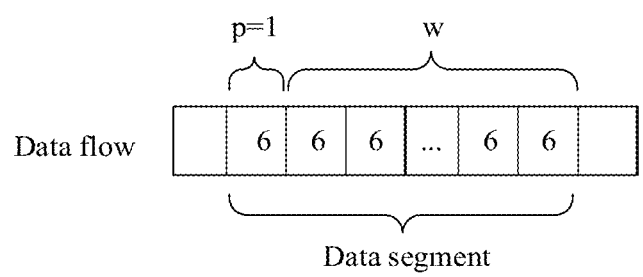
FIG. 1b is a schematic diagram in which a data distribution characteristic of a data segment in a data flow is plain distribution according to an embodiment of this application.

FIG. 1b is a schematic diagram in which a data distribution characteristic of a data segment in a data flow is the plain distribution. It can be learned from FIG. 1b that, when the data distribution characteristic of the data segment is the plain distribution, P=1, that is, an average length of chunks output by using the AE algorithm is (w+1) bytes. In addition, because E and w satisfy a relational expression w=E/(e−1), w≈1.4 bytes may be obtained through calculation. In other words, when the data distribution characteristic of the data segment is the plain distribution, the average length of chunks output by using the AE algorithm is about 2.4 bytes. Because an average length of chunks is usually hundreds of bytes, when the data distribution characteristic of the data segment is the plain distribution, a quantity of chunks output by using the AE algorithm is far greater than a quantity expected by a user. This further increases additional power consumption for calculating a hash value.

Figure 1C:
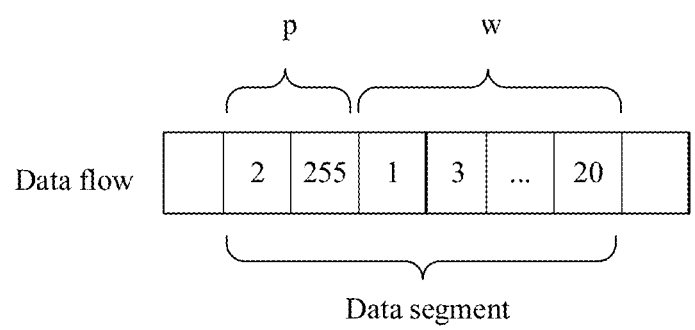
FIG. 1c is a schematic diagram in which a data distribution characteristic of a data segment in a data flow is plateau distribution according to an embodiment of this application.

FIG. 1c is a schematic diagram in which a data distribution characteristic of a data segment in a data flow is the plateau distribution. A character value 255 is a maximum character value in a range p+w. When a character in FIG. 1c is a single-byte character, the character value 255 is a maximum value in a value range corresponding to the single-byte character. Therefore, existence of the character value 255 enables the AE algorithm to ignore a character value of a subsequent character in a subsequent character value comparison process. In other words, occurrence of the plateau distribution disturbs a process of searching for a chunking position according to the AE algorithm that is based on the even distribution.

To resolve a disadvantage that only the even distribution is considered in the AE algorithm, an embodiment of this application provides a chunking algorithm, so as to improve chunking performance when a data distribution characteristic of a data segment is the non-even distribution.

FIG. 1d is a schematic diagram of a network architecture to which an embodiment of this application is applied. The network architecture shown in FIG. 1d includes: a network terminal device 101, a first service device 102, a second service device 103, and a data center (Data Center, DC)/headquarter (Headquarter, HQ) 104.

The network terminal device 101 is mainly configured to generate various types of data flows, and send the generated various types of data flows to the first service device 102 in a same local area network (Local Area Network, LAN). The network terminal device 101 may include but is not limited to a mobile phone, a tablet computer, a personal computer (Personal Computer, PC), a smart television, a smartwatch, a vehicle-mounted device, a wearable device, a virtual reality device, a terminal device in a future fifth generation (the 5th Generation, 5G) network, or another intelligent device having a voice function.

The first service device 102 and the second service device 103 may be network edge devices that provide an entry point to an enterprise or a service provider core network. The first service device 102 and the second service device 103 may include but are not limited to a router, a routing switch, an integrated access device, a multiplexer, and various wide area network (Wide Area Network, WAN) access devices. The first service device 102 is mainly configured to perform deduplication processing on various types of data flows sent by the network terminal device 101, and transmit the deduplicated data flow to the second service device 103 in the wide area network.

The second service device 103 is mainly configured to obtain an original data flow through parsing based on the deduplicated data flow sent by the first service device 102, and transmit the data flow obtained through parsing to the DC/HQ 104. The DC/HQ 104 is mainly configured to store, display, calculate, or transfer the data flow sent by the second service device 103.

In a process in which the first service device 102 performs deduplication processing on the data flow, the first service device 102 may first perform chunking processing on the data flow sent by the network terminal device 101. Specifically, a specific process in which the first service device 102 performs chunking processing on the data flow is as follows: The first service device 102 determines, starting from a header of the data flow, a first data segment whose character length is a first length (w1), determines, based on character values of all characters in the first data segment, a data distribution characteristic of the first data segment, execute a corresponding chunking policy based on the data distribution characteristic of the first data segment, to determine a chunking position of the data flow, and uses characters between a position of a first character and the chunking position in the first data segment as a data chunk. The character length is a quantity of included characters. In other words, the first data segment includes w1 characters. In an implementation, at least a first chunking policy and a second chunking policy may be configured in the first service device 102, and the first chunking policy determines the chunking position of the data flow based on an expected chunking length. The second chunking policy determines the chunking position of the data flow based on a second length. In an implementation, if the data distribution characteristic of the first data segment is the plain distribution, the first chunking policy is executed. If the data distribution characteristic of the first data segment is the non-plain characteristic, the second chunk policy is executed. It should be noted that the embodiments of this application are described by using an example in which each character in the first data segment is a single-byte character, but this does not constitute a limitation on the embodiments of this application. In another feasible implementation, each character in the first data segment may be a multi-byte character.

Because the first service device 102 may analyze the data distribution characteristic of the first data segment, and then execute different chunking policies for different data distribution characteristics to determine the chunking position, the chunking method provided in the embodiments of this application can better adapt to a data flow that has different data distribution characteristics, and output data chunks of different chunking lengths based on the different data distribution characteristics. In this way, a boundary offset problem can be effectively resolved, and the data flow can be better chunked, thereby enhancing a deduplication effect.

It should be noted that the network terminal device 101, the first service device 102, the second service device 103, and the DC/HQ 104 shown in FIG. 1d are separately used as separate physical entities, and are merely used as examples, and do not constitute a limitation on the embodiments of this application. In another feasible implementation, the network terminal device 101 and the first service device 102 may be integrated into a same physical entity, and the second service device 103 and the DC/HQ 104 may be integrated into a same physical entity.

It may be understood that the network architecture described in the embodiments of this application is intended to describe the technical solutions in the embodiments of this application more clearly, and does not constitute any limitation to the technical solutions provided in the embodiments of this application. A person of ordinary skill in the art may learn that with evolution of system architectures and appearance of new service scenarios, the technical solutions provided in the embodiments of this application are also applicable to a similar technical problem.

Figures 1, 7A:
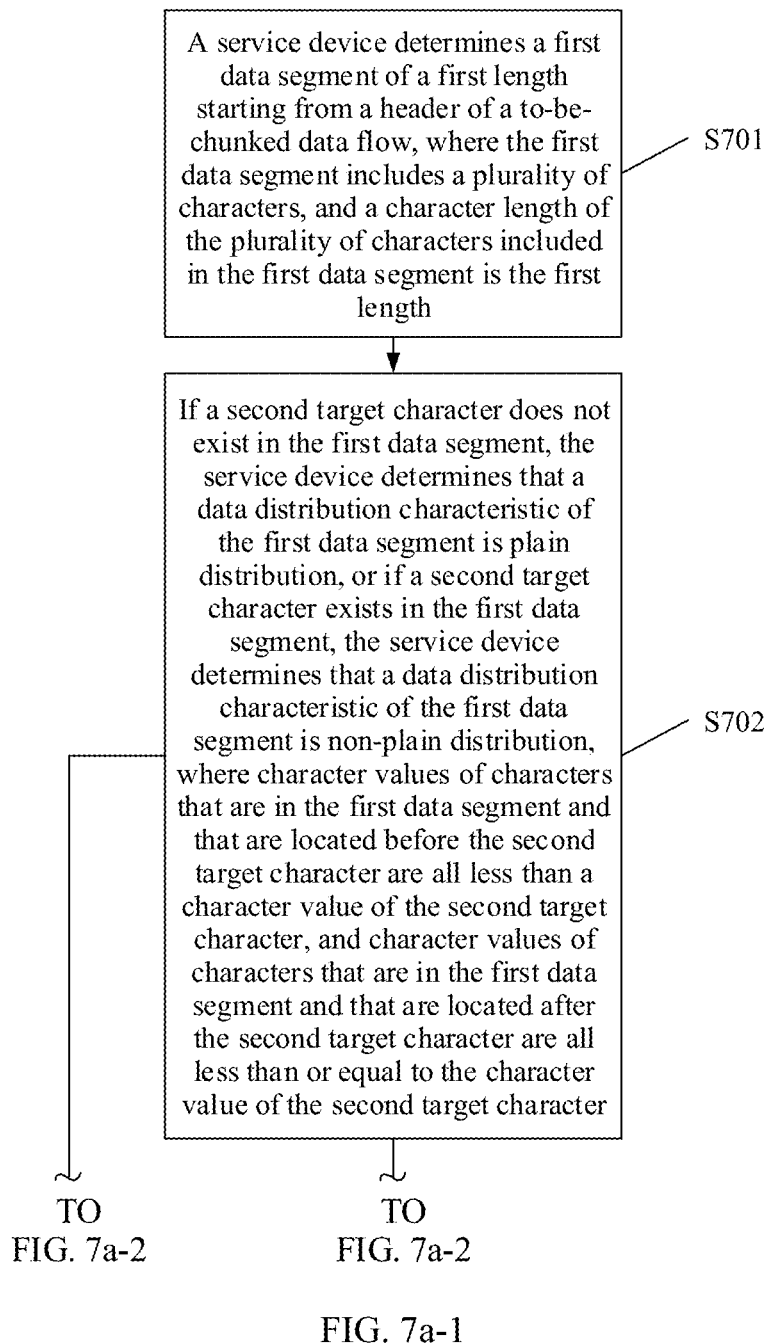
Figures 2, 7A:
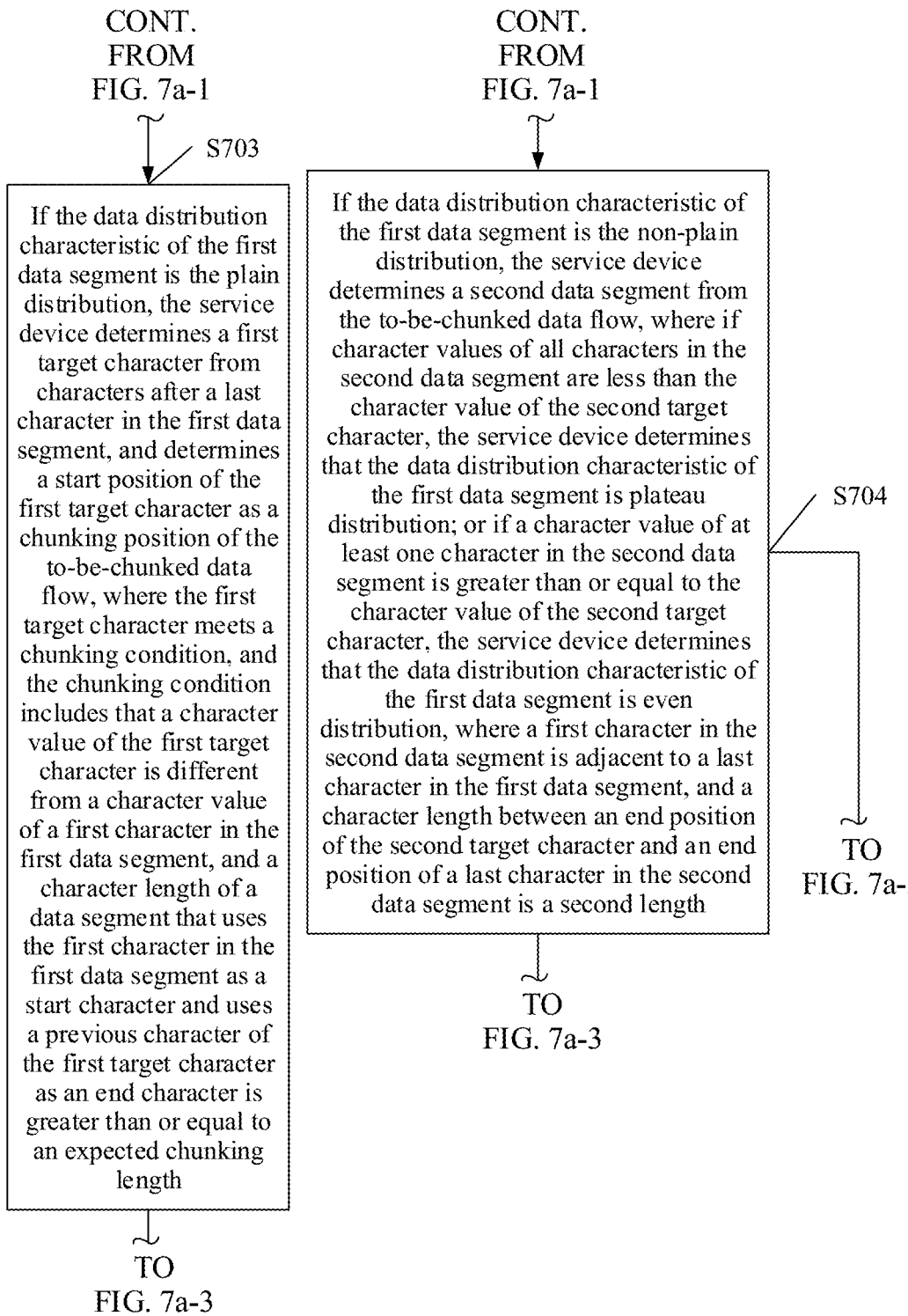
Figures 3, 7A:
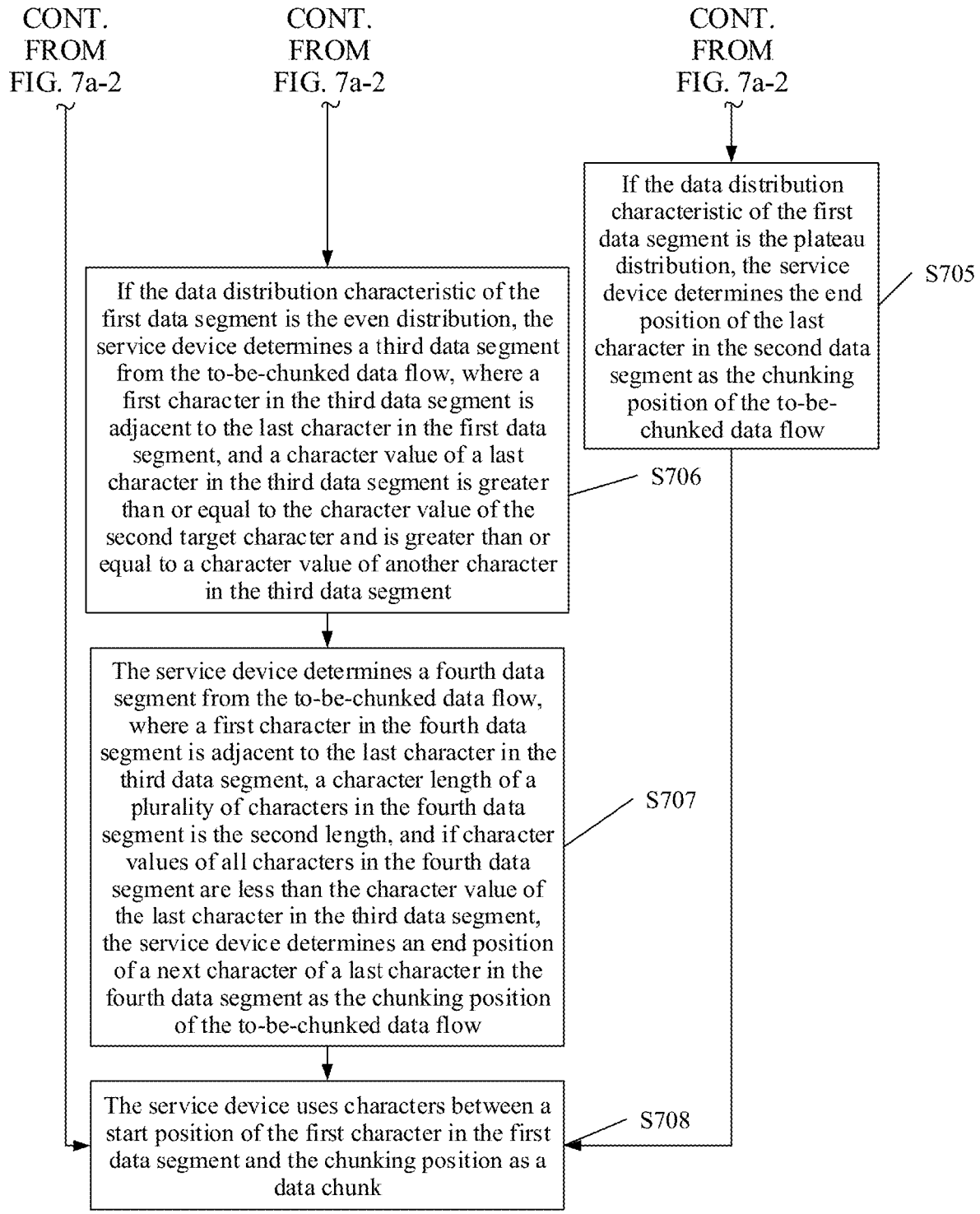

Based on the schematic diagram of the network architecture shown in FIG. 1d, FIG. 2 is a schematic flowchart of a chunking method according to an embodiment of this application. The method may include but is not limited to the following steps.

Step S201: A service device determines a first data segment of a first length starting from a header of a to-be-chunked data flow, where the first data segment includes a plurality of characters, and a character length of the plurality of characters included in the first data segment is the first length.

Specifically, after receiving a data flow, the service device may obtain the to-be-chunked data flow, and determine the first data segment of the first length (w1) starting from the header of the to-be-chunked data flow. In an implementation, the service device may continuously receive, from a receiving interface, different data that belongs to a same data flow. The service device may chunk the received data. In other words, the data flow may include to-be-chunked data and chunked data. All data in the to-be-chunked data flow is to-be-chunked data.

In an implementation, when all received data that belongs to a same data flow is to-be-chunked data, the header of the to-be-chunked data flow may be a start position of a first character in the data flow. In an implementation, when received data that belongs to a same data flow includes to-be-chunked data and chunked data, the header of the to-be-chunked data flow may be a start position of a next character (namely, a first character in the to-be-chunked data flow) of a last chunked character in the data flow.

In an implementation, the service device may obtain the to-be-chunked data flow from a queue. In an implementation, the service device may obtain the to-be-chunked data flow from the receiving interface, and then chunk the to-be-chunked data flow. In this manner, the to-be-chunked data flow can be chunked in real time, to improve deduplication efficiency. In an implementation, when the service device cannot chunk, in time, all to-be-chunked data flows obtained from the receiving interface, the service device may store some to-be-chunked data flows in the queue, so that the service device subsequently obtains the to-be-chunked data flows from the queue for chunking. The service device may be the first service device in FIG. 1d.

It should be noted that, in addition to the communication scenario shown in FIG. 1d, the chunking method disclosed in this embodiment of this application may be further applied to a data compression processing scenario of a single service device. For example, after receiving a to-be-stored data flow, the service device may chunk the to-be-stored data flow. Further, for a same chunk that has been stored, only a corresponding hash value of the chunk are to be stored. In this way, storage space utilization of the service device can be effectively improved. In an implementation, in addition to a router, a routing switch, an integrated access device, a multiplexer, and various wide area network access devices, the service device may be an electronic device such as a server, a mobile phone, or a computer.

Step S202: The service device determines a data distribution characteristic of the first data segment based on character values of all the characters in the first data segment.

Specifically, after determining the first data segment, the service device may calculate the character values of all the characters in the first data segment, determine the data distribution characteristic of the first data segment based on the character values of all the characters in the first data segment, and further execute a corresponding chunking policy based on the data distribution characteristic of the first data segment, to determine a chunking position of the to-be-chunked data flow.

In an implementation, the data distribution characteristic of the first data segment may be plain distribution or non-plain distribution, and a specific implementation in which the service device determines the data distribution characteristic of the first data segment based on the character values of all the characters in the first data segment may be as follows: If the character values of all the characters in the first data segment are the same, the service device determines that the data distribution characteristic of the first data segment is the plain distribution; or if at least two characters whose character values are different exist in the first data segment, that is, if the character values of all the characters in the first data segment are not completely the same, the service device determines that the data distribution characteristic of the first data segment is the non-plain distribution.

Step S203: The service device determines the chunking position of the to-be-chunked data flow based on the data distribution characteristic of the first data segment.

Specifically, a chunking policy executed by the service device to determine the chunking position of the to-be-chunked data flow varies based on the data distribution characteristic of the first data segment. In an implementation, when the service device executes different chunking policies, output chunking lengths may be different. The data distribution characteristic of the first data segment is analyzed, and then different chunking policies are executed for different data distribution characteristics to determine the chunking position, so that the chunking method provided in the embodiments of this application can better adapt to data flow that has different data distribution characteristics, and output data chunks of different chunking lengths based on the different data distribution characteristics. In this way, a boundary offset problem can be effectively resolved, and the data flow can be better chunked, thereby enhancing a deduplication effect.

Step S204: The service device uses characters between the start position of the first character in the first data segment and the chunking position as a data chunk.

Specifically, after determining the chunking position, the service device may classify the characters between the start position of the first character in the first data segment and the chunking position into a same data chunk. In other words, the data chunk obtained through classifying includes the first character in the first data segment.

It can be learned that, in this embodiment of this application, the data distribution characteristic of the first data segment can be obtained through analysis, and then different chunking policies are used for different data distribution characteristics to determine the chunking position. In this manner, the chunking method provided in this embodiment of this application can better adapt to a data flow that has different data distribution characteristics, and output data chunks of different chunking lengths based on the different data distribution characteristics. In this way, a boundary offset problem can be effectively resolved, and the data flow can be better chunked, thereby enhancing a deduplication effect.

Figure 3A:
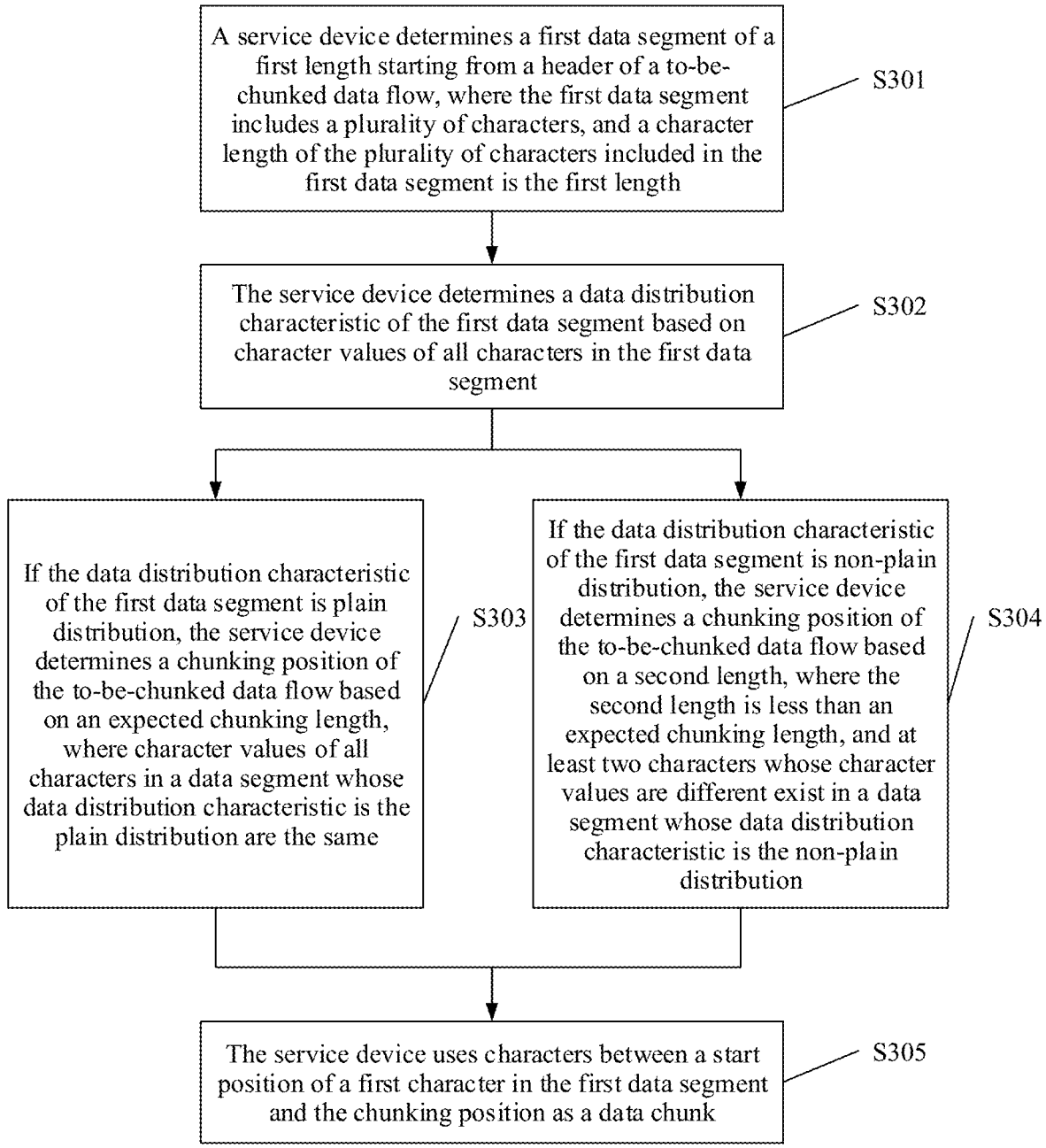
FIG. 3a is a schematic flowchart of another chunking method according to an embodiment of this application.

FIG. 3a is a schematic flowchart of another chunking method according to an embodiment of this application. The method briefly describes how to determine a chunking position of a to-be-chunked data flow based on an expected chunking length when a data distribution characteristic of a first data segment is plain distribution, and how to determine a chunking position of a to-be-chunked data flow based on a second length when the data distribution characteristic of the first data segment is non-plain distribution. The method may include but is not limited to the following steps.

Step S301: A service device determines a first data segment of a first length starting from a header of a to-be-chunked data flow, where the first data segment includes a plurality of characters, and a character length of the plurality of characters included in the first data segment is the first length.

Step S302: The service device determines a data distribution characteristic of the first data segment based on character values of all the character in the first data segment.

It should be noted that, for execution processes of step S301 and step S302, respectively refer to specific descriptions of step S201 and step S202 in FIG. 2, and details are not described herein again.

Step S303: If the data distribution characteristic of the first data segment is plain distribution, the service device determines a chunking position of the to-be-chunked data flow based on an expected chunking length, where character values of all characters in a data segment whose data distribution characteristic is the plain distribution are the same.

Specifically, at least a first chunking policy and a second chunking policy may be configured in the service device. If the data distribution characteristic of the first data segment is the plain distribution, the service device may execute the first chunking policy, in other words, determine the chunking position of the to-be-chunked data flow based on the expected chunking length. If the data distribution characteristic of the first data segment is non-plain distribution, the service device may execute the second chunking policy, in other words, determine the chunking position of the to-be-chunked data flow based on a second length.

The expected chunking length E and an expected chunking length in an AE algorithm are the same, and both are chunking lengths expected by a user. The expected chunking length may be set by the service device by default, or may be set by the service device based on a user operation. This is not limited in this embodiment of this application.

In an implementation, when the data distribution characteristic of the first data segment is the plain distribution, a specific implementation in which the service device determines the chunking position of the to-be-chunked data flow based on the expected chunking length may be as follows: The service device determines a position as the chunking position of the to-be-chunked data flow, where a character length between the position and a start position of a first character in the first data segment is the expected chunking length. It should be noted that, in this embodiment of this application, unless otherwise specified, a position of a character is a start position of the character.

A schematic diagram of a scenario in which the chunking position of the to-be-chunked data flow is determined based on the expected chunking length shown in FIG. 3b is used as an example. When the character length w1 of the first data segment is equal to 3, the expected chunking length E is equal to 30, c1 is the first character in the first data segment, c2 is a previous character of c1, c3 is a next character of c1, p1 is the start position of c1, and p3 is an end position of c1, it can be learned from the figure that character values of all characters in the first data segment are all 6. In other words, the data distribution characteristic of the first data segment is the plain distribution, and a character length between the start position (p1) of the first character in the first data segment and the position p2 in the figure is E. In this case, the service device may determine p2 as the chunking position of the to-be-chunked data flow. It should be noted that the start position (p1) of c1 is a junction between c1 and an adjacent character (c2) before c1. Similarly, the end position (p3) of c1 is a junction between c1 and an adjacent character (c3) after c1. It should be further noted that, when c1 is the first character in a data flow, that is, there is no other character before c1, a start position of the data flow is used as the start position of c1.

In an implementation, the service device may determine the first length based on the expected chunking length, and the first length is less than the expected chunking length.

Step S304: If the data distribution characteristic of the first data segment is the non-plain distribution, the service device determines the chunking position of the to-be-chunked data flow based on the second length, where the second length is less than the expected chunking length, and at least two characters whose character values are different exist in a data segment whose data distribution characteristic is the non-plain distribution.

The non-plain distribution may include plateau distribution, basin distribution, and even distribution. In an implementation, if at least two characters whose character values are different exist in the first data segment (that is, if the character values of all the characters in the first data segment are not completely the same), and a character value of the first character in the first data segment is a maximum value in the character values of all the characters in the first data segment, the service device may determine that the data distribution characteristic of the first data segment is the plateau distribution. If at least two characters whose character values are different exist in the first data segment, and a character value of the first character in the first data segment is a minimum value in the character values of all the characters in the first data segment, the service device may determine that the data distribution characteristic of the first data segment is the basin distribution. If at least two characters whose character values are different exist in the first data segment, and a character value of the first character in the first data segment is less than a maximum value in the character values of all the characters in the first data segment (alternatively, the character value of the first character in the first data segment is greater than a minimum value in the character values of all the characters in the first data segment), the service device may determine that the data distribution characteristic of the first data segment is the even distribution.

In an implementation, if the data distribution characteristic of the first data segment is the plateau distribution, the service device may determine a second data segment backward along the to-be-chunked data flow starting from an end position of a plateau character (namely, the first character in the first data segment), and determine an end position of a last character in the second data segment as the chunking position of the to-be-chunked data flow. A character length between the end position of the plateau character and the end position of the last character in the second data segment is the second length (w2).

In an implementation, if the data distribution characteristic of the first data segment is the basin distribution, the service device may determine a fifth data segment backward along the to-be-chunked data flow starting from an end position of a basin character (namely, the first character in the first data segment), and determine an end position of a last character in the fifth data segment as the chunking position of the to-be-chunked data flow. A character length between the end position of the basin character and the end position of the last character in the fifth data segment is w2.

In an implementation, if the data distribution characteristic of the first data segment is the even distribution, the service device may view w2 characters backward along the to-be-chunked data flow starting from a character corresponding to a first maximum value in the character values of the first data segment. If character values of the w2 characters are all less than or equal to the first maximum value in the character values of the first data segment, the service device may determine an end position of the viewed w2 characters as the chunking position of the to-be-chunked data flow. In another implementation, if the data distribution characteristic of the first data segment is the even distribution, the service device may view w2 characters backward along the to-be-chunked data flow starting from a character corresponding to a first minimum value in the character values of the first data segment. If character values of the w2 characters are all greater than or equal to the first minimum value in the character values of the first data segment, the service device may determine an end position of the viewed w2 characters as the chunking position of the to-be-chunked data flow.

The second length may be determined by the service device based on the expected chunking length, the second length is less than the expected chunking length, and a sum of the first length and the second length is less than or equal to the expected chunking length.

Step S305: The service device uses characters between the start position of the first character in the first data segment and the chunking position as a data chunk.

Specifically, after determining the chunking position, the service device may classify the characters between the start position of the first character in the first data segment and the chunking position into a same data chunk. In other words, the data chunk obtained through chunking includes the first character in the first data segment.

FIG. 3b is used as an example. The service device may classify characters between the start position (p1) of c1 and the chunking position (p2) into a data chunk. In other words, the service device may chunk, starting from a header of the first data segment, a data segment whose character length is the expected chunking length E into a data chunk. Because the character length between p1 and p2 is the expected chunking length, the characters between the start position of the first character in the first data segment and the chunking position are chunked into a same data chunk, so that a character length of the data chunk obtained through chunking is equal to the expected chunking length. In this way, power consumption of calculating a hash value of the data chunk by the service device can be effectively controlled.

It can be learned that, in this embodiment of this application, the data distribution characteristic of the first data segment can be obtained through analysis, and then different chunking policies are used for different data distribution characteristics to determine the chunking position. In this manner, the chunking method provided in the embodiments of this application can better adapt to a data flow that has different data distribution characteristics, and output data chunks of different chunking lengths based on the different data distribution characteristics. In this way, a boundary offset problem can be effectively resolved, and the data flow can be better chunked, thereby enhancing a deduplication effect.

FIG. 4a is a schematic flowchart of still another chunking method according to an embodiment of this application. The method describes in detail how to determine, based on character values of all characters in a first data segment, that a data distribution characteristic of the first data segment is plain distribution, and how to determine a chunking position of a to-be-chunked data flow based on an expected chunking length when the data distribution characteristic of the first data segment is the plain distribution. The method may include but is not limited to the following steps.

Step S401: A service device determines a first data segment of a first length starting from a header of a to-be-chunked data flow, where the first data segment includes a plurality of characters, and a character length of the plurality of characters included in the first data segment is the first length.

It should be noted that for a process of performing step S401, refer to specific descriptions of step S201 in FIG. 2. Details are not described herein again.

Step S402: If a character value of a first character in the first data segment is a maximum value in character values of the characters in the first data segment, and the character value of the first character in the first data segment is equal to a character value of a last character in the first data segment, the service device determines that a data distribution characteristic of the first data segment is plain distribution.

Specifically, after determining the first data segment, the service device may calculate the character values of all characters in the first data segment, and determine the maximum value in the character values of all the characters in the first data segment based on the character values of all the characters in the first data segment. If the character value of the first character in the first data segment is the maximum value in the character values of all the characters in the first data segment, and the character value of the first character in the first data segment is equal to the character value of the last character in the first data segment, it is determined that the data distribution characteristic of the first data segment is the plain distribution. If the character value of the first character in the first data segment is less than the maximum value in the character values of all the characters in the first data segment, or the character value of the first character in the first data segment is unequal to the character value of the last character in the first data segment, it is determined that the data distribution characteristic of the first data segment is non-plain distribution.

When the character value of the first character in the first data segment is the maximum value in the character values of all the characters in the first data segment, and the character value of the first character in the first data segment is equal to the character value of the last character in the first data segment, it indicates that the character value of the first character in the first data segment and the character value of the last character in the first data segment are equal, and both are equal to a maximum character value in the first data segment. Therefore, it can be learned that character values of characters between the first character and the last character in the first data segment are all less than or equal to the maximum character value. In this case, it may be considered that a probability that the character values of all the characters in the first data segment are equal and are all equal to the maximum character value is relatively high. Therefore, the service device may determine that the data distribution characteristic of the first data segment is the plain distribution. In addition, a specific implementation of determining whether the character values of all the characters in the first data segment are the same may be: first determining a maximum character value in the character values of all the characters in the first data segment; successively determining whether the character values of all the characters in the first data segment are equal to the maximum character value; and if the character values of all the characters in the first data segment are equal to the maximum character value, determining that the character values of all the characters in the first data segment are the same. In comparison with determining whether the character values of all the characters in the first data segment are the same, in this embodiment of this application, only the maximum character value in the character values of all the characters in the first data segment are to be determined, and then, whether the character value of the first character and the character value of the last character in the first data segment are both equal to the maximum character value may be compared to determine whether the data distribution characteristic of the first data segment is the plain distribution. It can be learned that the data distribution characteristic of the first data segment can be determined more quickly by using the method in this embodiment of this application. Therefore, chunking efficiency of the to-be-chunked data flow is improved.

When the character value of the first character in the first data segment is less than the maximum value in the character values of all the characters in the first data segment, or the character value of the first character in the first data segment is not equal to the character value of the last character in the first data segment, it indicates that at least two characters whose character values are unequal exist in the first data segment. Therefore, the service device may determine that the data distribution characteristic of the first data segment is the non-plain distribution.

In an implementation, a specific implementation in which the service device determines whether the data distribution characteristic of the first data segment is the plain distribution may further be: If the character value of the first character in the first data segment is a minimum value in the character values of all the characters in the first data segment, and the character value of the first character in the first data segment is equal to the character value of the last character in the first data segment, the service device determines that the data distribution characteristic of the first data segment is the plain distribution; or if the character value of the first character in the first data segment is greater than a minimum value of the character values of all the characters in the first data segment, or the character value of the first character in the first data segment is not equal to the character value of the last character in the first data segment, the service device determines that the data distribution characteristic of the first data segment is the non-plain distribution.

When the character value of the first character in the first data segment is the minimum value in the character values of all the characters in the first data segment, and the character value of the first character in the first data segment is equal to the character value of the last character in the first data segment, it indicates that the character value of the first character in the first data segment and the character value of the last character in the first data segment are equal, and both are equal to the minimum character value in the first data segment. Therefore, it can be learned that character values of characters between the first character and the last character in the first data segment are all greater than or equal to the minimum character value. In this case, it may be considered that a probability that the character values of all the characters in the first data segment are equal and are all equal to the minimum character value is relatively high. Therefore, the service device may determine that the data distribution characteristic of the first data segment is the plain distribution. In addition, in comparison with determining whether the character values of all the characters in the first data segment are the same, in this embodiment of this application, only the minimum character value in the character values of all the characters in the first data segment are to be determined, and then, whether the character value of the first character and the character value of the last character in the first data segment are both equal to the minimum character value may be compared to determine whether the data distribution characteristic of the first data segment is the plain distribution. It can be learned that the data distribution characteristic of the first data segment can be determined more quickly by using the method in this embodiment of this application. Therefore, chunking efficiency of the to-be-chunked data flow is improved. When the character value of the first character in the first data segment is greater than the maximum value in the character values of all the characters in the first data segment, or the character value of the first character in the first data segment is not equal to the character value of the last character in the first data segment, it indicates that at least two characters whose character values are unequal exist in the first data segment. Therefore, the service device may determine that the data distribution characteristic of the first data segment is the non-plain distribution.

Step S403: If the data distribution characteristic of the first data segment is the plain distribution, the service device determines a chunking position of the to-be-chunked data flow based on an expected chunking length.

In an implementation, when the data distribution characteristic of the first data segment is the plain distribution, a specific implementation in which the service device determines the chunking position of the to-be-chunked data flow based on the expected chunking length may be as follows: The service device determines a first target character from characters after the last character in the first data segment, and determines a start position of the first target character as the chunking position of the to-be-chunked data flow. The first target character meets a chunking condition, and the chunking condition includes: a character value of the first target character is different from the character value of the first character in the first data segment, and a character length of a data segment for which the first character in the first data segment is used as a start character and a previous character of the first target character is used as an end character is greater than or equal to the expected chunking length.

Specifically, the service device may successively traverse a next character starting from a first character after the last character in the first data segment, suspend traversing characters until a character value of a currently viewed character is different from the character value of the first character in the first data segment, and determine whether a character length of a data segment for which the first character in the first data segment is used as a start character and a previous character of the currently viewed character is used as an end character is greater than or equal to the expected chunking length. If the character length of the data segment for which the first character in the first data segment is used as the start character and the character before the currently viewed character is used as the end character is greater than or equal to the expected chunking length, the service device determines the currently viewed character as the first target character. If the character length of the data segment for which the first character in the first data segment is used as the start character and the character before the currently viewed character is used as the end character is less than the expected chunking length, the service device continues to traverse a next character until a currently viewed character meets two chunking conditions at the same time (that is, a character value of the currently viewed character is different from the character value of the first character in the first data segment, and a character length of a data segment for which the first character in the first data segment is used as a start character and a previous character of the currently viewed character is used as an end character is greater than or equal to the expected chunking length), and determines the currently viewed character as the first target character.

Figure 4B:
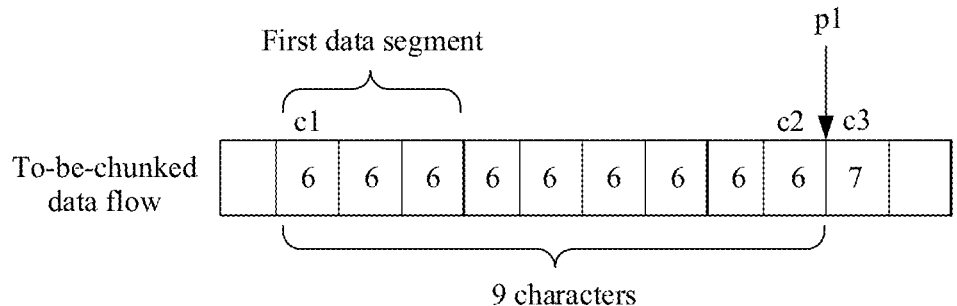
FIG. 4b is a schematic diagram of a scenario in which a chunking position of a to-be-chunked data flow is determined when a data distribution characteristic of a first data segment is plain distribution according to an embodiment of this application.

In this embodiment of this application, if the data distribution characteristic of the first data segment is the plain distribution, the service device may determine the start position of the first target character as the chunking position of the to-be-chunked data flow. For example, FIG. 4*b* is a schematic diagram of a scenario in which the chunking position of the to-be-chunked data flow is determined when the data distribution characteristic of the first data segment is the plain distribution. The character length w1 of the first data segment is equal to 3, the expected chunking length E is equal to 8, and c1 is the first character in the first data segment. It can be learned from FIG. 4*b* that a character value 7 of a character c3 in the figure is different from a character value 6 of the character c1, and a character length of a data segment for which the character c1 is used as a start character and a previous character (c2) of the character c3 is used as an end character is 9 (in other words, greater than the expected chunking length E). Therefore, the character c3 meets the chunking condition. In this case, the service device may determine the character c3 as the first target character. After determining the first target character, the service device may determine the start position (p1) of the first target character as the chunking position of the to-be-chunked data flow.

In this embodiment of this application, when the data distribution characteristic of the first data segment is the plain distribution, the start position of the first target character that meets the two chunking conditions is determined as the chunking position. On one hand, the character length of the data chunk that is determined based on the chunking position may be greater than or equal to the expected chunking length, to avoid a case in which a length of a data chunk output by using an AE algorithm is less than the expected chunking length when the data distribution characteristic of the first data segment is the plain distribution. In this way, power consumption of calculating a hash value of the data chunk by the service device can be effectively reduced. On the other hand, more characters with a same character value may be chunked into a same data chunk as much as possible, to improve a deduplication rate and enhance a deduplication effect.

In an implementation, when the data distribution characteristic of the first data segment is the plain distribution, a specific implementation in which the service device determines the chunking position of the to-be-chunked data flow based on the expected chunking length may be as follows: The service device determines a position as the chunking position of the to-be-chunked data flow, where a character length between the position and a start position of a first character in the first data segment is the expected chunking length. In this embodiment of this application, when it is determined that the data distribution characteristic of the first data segment is the plain distribution, a probability that a data distribution characteristic of a data segment (for example, a data segment whose character length is E−w1) that is after and adjacent to the first data segment is also the plain distribution is relatively high. Therefore, the service device determines the position as the chunking position of the to-be-chunked data flow, where the character length between the position and the start position of the first character in the first data segment is the expected chunking length. On one hand, the first data segment and the data segment that is after and adjacent to the first data segment and whose character length is E−w1 that are of the plain distribution may be chunked into a same data chunk. In this way, more characters with a same character value may be chunked into the same data chunk as much as possible, so as to improve a deduplication rate and enhance a deduplication effect. On the other hand, character values of all characters in the data segment whose character length is E−w1 may not be calculated. In this way, chunking efficiency can be improved, and a throughput of a deduplication system can be improved.

Step S404: The service device uses characters between the start position of the first character in the first data segment and the chunking position as a data chunk.

It should be noted that, for a process of performing step S404, refer to specific descriptions of step S305 in FIG. 3a. Details are not described herein again.

In this embodiment of this application, when the character value of the first character in the first data segment is the maximum value in the character values of the characters in the first data segment, and the character value of the first character in the first data segment is equal to the character value of the last character in the first data segment, the service device determines the data distribution characteristic of the first data segment as the plain distribution. In this way, the data distribution characteristic of the first data segment can be determined more quickly, to improve chunking efficiency of the to-be-chunked data flow.

Figure 5A:
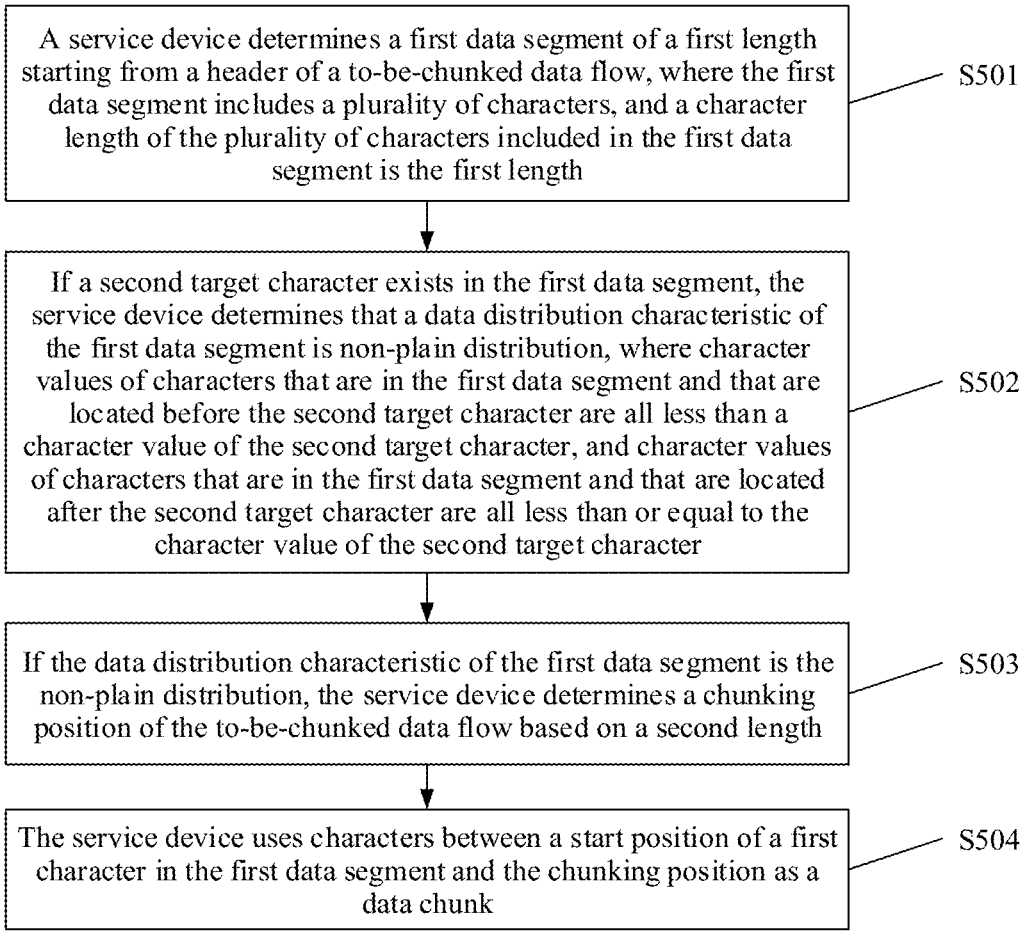
FIG. 5a is a schematic flowchart of still another chunking method according to an embodiment of this application.

FIG. 5a is a schematic flowchart of still another chunking method according to an embodiment of this application. The method describes in detail how to determine, based on character values of all characters in a first data segment, that a data distribution characteristic of the first data segment is non-plain distribution, and how to determine a chunking position of a to-be-chunked data flow based on a second length when the data distribution characteristic of the first data segment is the non-plain distribution. The method may include but is not limited to the following steps.

Step S501: A service device determines a first data segment of a first length starting from a header of a to-be-chunked data flow, where the first data segment includes a plurality of characters, and a character length of the plurality of characters included in the first data segment is the first length.

It should be noted that for a process of performing step S501, refer to specific descriptions of step S201 in FIG. 2. Details are not described herein again.

Step S502: If a second target character exists in the first data segment, the service device determines that a data distribution characteristic of the first data segment is non-plain distribution, where character values of characters that are in the first data segment and that are located before the second target character are all less than a character value of the second target character, and character values of characters that are in the first data segment and that are located after the second target character are all less than or equal to the character value of the second target character.

Figure 5B:
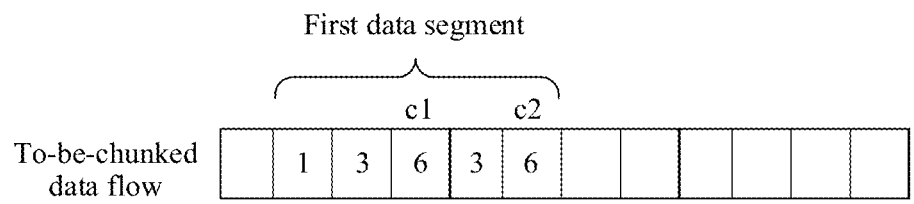
FIG. 5b is a schematic diagram of a scenario of determining a second target character according to an embodiment of this application.

Specifically, after determining the first data segment, the service device may traverse all characters in the first data segment to determine whether the second target character exists in the first data segment. The second target character meets the following condition: Character values of characters that are in the first data segment and that are located before the second target character are all less than the character value of the second target character, and character values of characters that are in the first data segment and that are located after the second target character are all less than or equal to the character value of the second target character. It can be learned according to the condition met by the second target character that, the character value of the second target character is a maximum character value in character values of all characters in the first data segment, and there is at least one character before the second target character in the first data segment. Because the character values of the characters that are in the first data segment and that are located before the second target character are all less than the character value of the second target character, a character value of a first character in the first data segment is less than the character value of the second target character. Therefore, at least two characters whose character values are different exist in the first data segment. In this case, the service device may determine that the data distribution characteristic of the first data segment is non-plain distribution. In an implementation, character values of one or more characters in the first data segment may all be maximum character values. When the character values of a plurality of characters in the first data segment are all the maximum character values, a character corresponding to a first maximum character value is determined as the second target character. A schematic diagram of a scenario of determining the second target character shown in FIG. 5b is used as an example. A character length w1 of the first data segment is equal to 5. As shown in the figure, the maximum character value in the first data segment is 6, and character values 6 of a third character (c1) and a fifth character (c2) in the first data segment are both maximum character values. The character value of c1 is the first maximum character value in the first data segment. In this case, the service device may determine c1 as the second target character.

In this embodiment of this application, the service device may determine the data distribution characteristic of the first data segment based on whether the second target character exists in the first data segment. If the second target character does not exist in the first data segment, it indicates that the character values of all the characters in the first data segment are the same. In this case, the service device may determine that the data distribution characteristic of the first data segment is plain distribution. If the second target character exists in the first data segment, the service device determines that the data distribution characteristic of the first data segment is the non-plain distribution.

Step S503: If the data distribution characteristic of the first data segment is the non-plain distribution, the service device determines a chunking position of the to-be-chunked data flow based on a second length.

In an implementation, if the data distribution characteristic of the first data segment is the non-plain distribution, a specific implementation in which the service device determines the chunking position of the to-be-chunked data flow based on the second length may be as follows:

s5031: The service device determines a third data segment from the to-be-chunked data flow, where a first character in the third data segment is adjacent to a last character in the first data segment, a character value of a last character in the third data segment is greater than or equal to the character value of the second target character and is greater than or equal to a character value of another character in the third data segment, and the first character in the third data segment is a next character of the last character in the first data segment.

s5032: The service device determines a fourth data segment from the to-be-chunked data flow, where a first character in the fourth data segment is adjacent to the last character in the third data segment, a character length of a plurality of characters in the fourth data segment is the second length, and the first character in the fourth data segment is a next character of the last character in the third data segment.

s5033: If character values of all characters in the fourth data segment are less than the character value of the last character in the third data segment, the service device determines an end position of a last character in the fourth data segment as the chunking position of the to-be-chunked data flow.

Specifically, the service device may successively traverse a next character starting from a first character after the last character in the first data segment, suspend traversing characters until a character value of a currently viewed character is greater than or equal to the character value of the second target character, and determine the currently viewed character as an X character. Then, the service device successively traverses w2 characters starting from a first character after the X character. If character values of the w2 characters are all less than a character value of the X character, the service device may determine an end position of a viewed $w2^{nd}$ character as the chunking position of the to-be-chunked data flow. A start character in the third data segment is the first character after the last character in the first data segment, and an end character in the third data segment is the X character. A start character in the fourth data segment is the first character after the X character, and an end character in the fourth data segment is the viewed $w2^{nd}$ character.

In an implementation, if at least one Y character whose character value is greater than or equal to the character value of the X character exists in the traversed w2 characters, the service device updates the X character to the Y character. Then, the service device successively traverses w2 characters again starting from a first character after the updated X character. If character values of the w2 characters are all less than a character value of the updated X character, the service device may determine, as the chunking position, an end position of the $w2^{nd}$ character that is viewed starting from the first character after the updated X character. A start character in the third data segment is the first character after the last character in the first data segment, and an end character in the third data segment is the updated X character. A start character in the fourth data segment is the first character after the updated X character, and an end character in the fourth data segment is the $w2^{nd}$ character viewed starting from the first character after the updated X character.

Figure 5C:
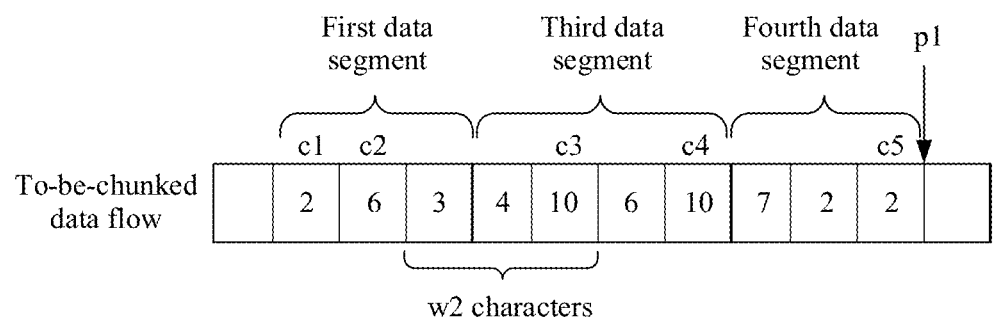
FIG. 5c is a schematic diagram of a scenario of determining an X character according to an embodiment of this application.

In an implementation, if character values of at least two Y characters in the traversed w2 characters are greater than or equal to the character value of the X character, the service device may determine that a character whose last character value is greater than or equal to the character value of the X character is the updated X character. A schematic diagram of a scenario of determining the X character shown in FIG. 5c is used as an example. A character length w1 of the first data segment is equal to 3, c1 is the first character in the first data segment, and c2 is the second target character; c3 is a second character in the third data segment, and c4 is a fourth character in the third data segment; and a character length w2 of the fourth data segment is equal to 3, c5 is the last character in the fourth data segment, and p1 is the end position of c5. It can be learned from the figure that a start position of the first character (c1) in the first data segment is different from a start position of the second target character (c2). Therefore, the data distribution characteristic of the first data segment is the non-plain distribution. It can be learned from the figure that c3 is the first character whose character value is greater than or equal to the character value of c2 starting from the first character after the last character in the first data segment, and c4 is the last character whose character value is greater than or equal to a character value of c3 in the third data segment. In addition, character values of w2 characters (that is, each character in the fourth data segment) after c4 are all less than a character value of c4. In this case, the service device may determine c4 as the X character. It should be noted that, in ranges of the first data segment, the third data segment, and the fourth data segment, character values of characters before the X character are all less than or equal to the character value of the X character, and character values of characters after the X character are all less than the character value of the X character.

In this embodiment of this application, the service device may determine the end position of the last character in the fourth data segment as the chunking position of the to-be-chunked data flow. For example, in FIG. 5c, the end position (p1) of c5 may be determined as the chunking position of the to-be-chunked data flow.

In this embodiment of this application, if the service device determines, based on the second target character, that the data distribution characteristic of the first data segment is the non-plain distribution, the service device may determine the second data segment from the to-be-chunked data flow, and further determine, based on character values of all characters in the second data segment, whether the data distribution characteristic of the first data segment is plateau distribution or even distribution. A first character in the second data segment is adjacent to the last character in the first data segment, a character length between the end position of the second target character and an end position of a last character in the second data segment is the second length, and the first character in the second data segment is a next character of the last character in the first data segment.

Specifically, a specific implementation in which the service device determines, based on the character values of all the characters in the second data segment, whether the data distribution characteristic of the first data segment is the plateau distribution or the even distribution may be as follows: If the character values of all the characters in the second data segment are less than the character value of the second target character, the service device may determine that the data distribution characteristic of the first data segment is the plateau distribution, or if at least one character whose character value is greater than or equal to the character value of the second target character exists in the second data segment, the service device may determine that the data distribution characteristic of the first data segment is the even distribution.

Figure 5D:
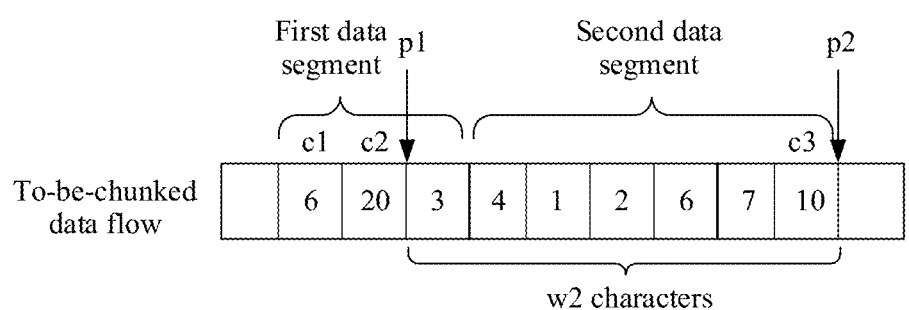
FIG. 5d is a schematic diagram of a scenario in which a chunking position of a to-be-chunked data flow is determined when a data distribution characteristic of a first data segment is plateau distribution according to an embodiment of this application.

In an implementation, if the data distribution characteristic of the first data segment is the plateau distribution, a specific implementation in which the service device determines the chunking position of the to-be-chunked data flow based on the second length may be as follows: determining the end position of the last character in the second data segment as the chunking position of the to-be-chunked data flow. For example, FIG. 5d is a schematic diagram of a scenario in which the chunking position of the to-be-chunked data flow is determined when the data distribution characteristic of the first data segment is the plateau distribution. The character length w1 of the first data segment is equal to 3, and w2 is equal to 7. It can be learned from FIG. 5d that, c1 is the first character in the first data segment, and the character value of c2 is a maximum character value in the first data segment. That is, c2 is the second target character, p1 is the end position of c2, c3 is the last character in the second data segment, p2 is an end position of c3, and a character length between p1 and p2 (namely, between the end position of the second target character and the end position of the last character in the second data segment) is w2. The start position of the first character (c1) in the first data segment is different from the start position of the second target character (c2), and the character values of all the characters in the second data segment are less than the character value 20 of the second target character (c2). In this case, the data distribution characteristic of the first data segment is the plateau distribution. Therefore, the service device may determine the end position (p2) of the last character in the second data segment as the chunking position of the to-be-chunked data flow.

In an implementation, if the data distribution characteristic of the first data segment is the even distribution, for an execution process in which the service device determines the chunking position of the to-be-chunked data flow based on the second length, refer to specific descriptions of steps s5031 to s5033. Details are not described herein again.

Step S504: The service device uses characters between the start position of the first character in the first data segment and the chunking position as a data chunk.

It should be noted that, for a process of performing step S504, refer to specific descriptions of step S305 in FIG. 3a. Details are not described herein again.

In this embodiment of this application, after it is determined, based on the second target character, that the data distribution characteristic of the first data segment is the non-plain distribution, it may be further determined, based on the character values of all the characters in the second data segment, whether the data distribution characteristic of the first data segment is the plateau distribution or the even distribution, and different chunking policies are further executed for different data distribution characteristics, to determine the chunking position. In this manner, the chunking method provided in this embodiment of this application can better adapt to a data flow that has different data distribution characteristics, and data chunks of different chunking lengths are output for different data distribution characteristics. In this way, a boundary offset problem can be effectively resolved, the data flow can be better chunked, thereby enhancing a deduplication effect.

Figure 6:
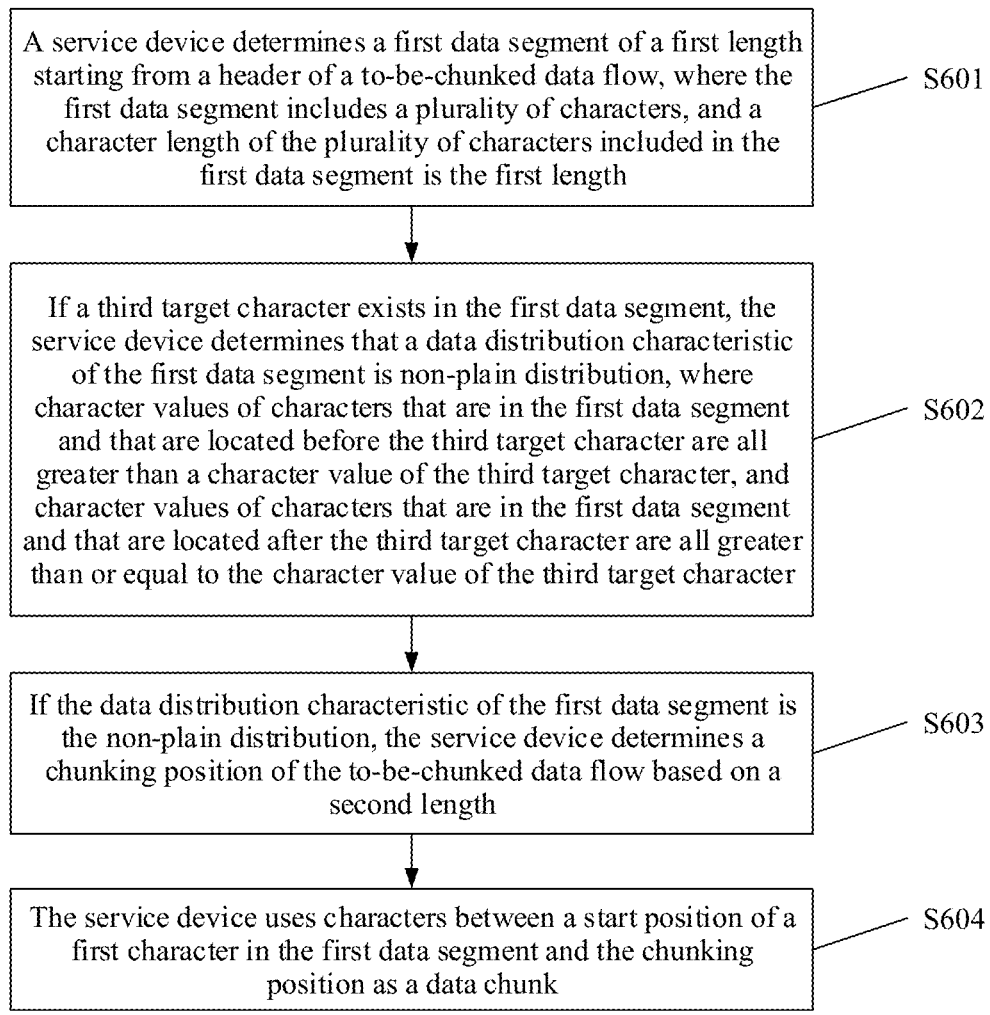
FIG. 6 is a schematic flowchart of still another chunking method according to an embodiment of this application.

FIG. 6 is a schematic flowchart of still another chunking method according to an embodiment of this application. The method describes in detail how to determine, based on character values of all characters in a first data segment, that a data distribution characteristic of the first data segment is non-plain distribution, and how to determine a chunking position of a to-be-chunked data flow based on a second length when the data distribution characteristic of the first data segment is the non-plain distribution. The method may include but is not limited to the following steps.

Step S601: A service device determines a first data segment of a first length starting from a header of a to-be-chunked data flow, where the first data segment includes a plurality of characters, and a character length of the plurality of characters included in the first data segment is the first length.

It should be noted that, for a process of performing step S601, refer to specific descriptions of step S201 in FIG. 2. Details are not described herein again.

Step S602: If a third target character exists in the first data segment, the service device determines that a data distribution characteristic of the first data segment is non-plain distribution, where character values of characters that are in the first data segment and that are located before the third target character are all greater than a character value of the third target character, and character values of characters that are in the first data segment and that are located after the third target character are all greater than or equal to the character value of the third target character.

Specifically, after determining the first data segment, the service device may traverse all characters in the first data segment to determine whether the third target character exists in the first data segment. The third target character meets the following condition: The character values of the characters that are in the first data segment and that are located before the third target character are all greater than the character value of the third target character, and the character values of the characters that are in the first data segment and that are located after the third target character are all greater than or equal to the character value of the third target character. It can be learned according to the condition met by the third target character that, the character value of the third target character is a minimum character value in character values of all the characters in the first data segment, and there is at least one character before the third target character in the first data segment. Because the character values of the characters that are in the first data segment and that are located before the third target character are all greater than the character value of the third target character, a character value of a first character in the first data segment is greater than the character value of the third target character. Therefore, at least two characters whose character values are different exist in the first data segment. In this case, the service device may determine that the data distribution characteristic of the first data segment is the non-plain distribution. In an implementation, character values of one or more characters in the first data segment may all be minimum character values. When the character values of a plurality of characters in the first data segment are all the minimum character values, a character corresponding to a first minimum character value is determined as the third target character.

In this embodiment of this application, the service device may determine the data distribution characteristic of the first data segment based on whether the third target character exists in the first data segment. If the third target character does not exist in the first data segment, it indicates that the character values of all the characters in the first data segment are the same. In this case, the service device may determine that the data distribution characteristic of the first data segment is plain distribution. If the third target character exists in the first data segment, the service device determines that the data distribution characteristic of the first data segment is the non-plain distribution.

Step S603: If the data distribution characteristic of the first data segment is the non-plain distribution, the service device determines a chunking position of the to-be-chunked data flow based on a second length.

In an implementation, if the data distribution characteristic of the first data segment is the non-plain distribution, a specific implementation in which the service device determines the chunking position of the to-be-chunked data flow based on the second length may be as follows:

s6031: The service device determines a sixth data segment from the to-be-chunked data flow, where a first character in the sixth data segment is adjacent to a last character in the first data segment, a character value of a last character in the sixth data segment is less than or equal to the character value of the third target character and is less than or equal to a character value of another character in the sixth data segment, and the first character in the sixth data segment is a next character of the last character in the first data segment.

s6032: The service device determines a seventh data segment from the to-be-chunked data flow, where a first character in the seventh data segment is adjacent to the last character in the sixth data segment, a character length of a plurality of characters in the seventh data segment is the second length, and the first character in the seventh data segment is a next character of the last character in the sixth data segment.

s6033: If character values of all characters in the seventh data segment are greater than the character value of the last character in the sixth data segment, the service device determines an end position of a last character in the seventh data segment as the chunking position of the to-be-chunked data flow.

Specifically, the service device may successively traverse a next character starting from a first character after the last character in the first data segment, suspend traversing characters until a character value of a currently viewed character is less than or equal to the character value of the third target character, and determine the currently viewed character as an A character. Then, the service device successively traverses w2 characters starting from a first character after the A character. If character values of the w2 characters are all greater than a character value of the A character, the service device may determine an end position of a viewed $w2^{nd}$ character as the chunking position of the to-be-chunked data flow. A start character in the sixth data segment is the first character after the last character in the first data segment, an end character in the sixth data segment is the character A, a start character in the seventh data segment is the first character after the character A, and an end character in the seventh data segment is the viewed $w2^{nd}$ character.

In an implementation, if at least one B character whose character value is less than or equal to the character value of the A character exists in the traversed w2 characters, the service device updates the A character to the B character. Then, the service device successively traverses w2 characters again starting from a first character after the updated A character. If character values of the w2 characters are all greater than a character value of the updated A character, the service device may determine, as the chunking position, an end position of the $w2^{nd}$ character that is viewed starting from the first character after the updated A character. The start character in the sixth data segment is the first character after the last character in the first data segment, the end character in the sixth data segment is the updated A character, the start character in the seventh data segment is the first character after the updated A character, and the end character in the seventh data segment is the $w2^{nd}$ character that is viewed starting from the first character after the updated A character.

In an implementation, if character values of at least two B characters in the traversed w2 characters are less than or equal to the character value of the A character, the service device may determine that a character whose last character value is less than or equal to the character value of the A character is the updated A character. It should be noted that, in ranges of the first data segment, the sixth data segment, and the seventh data segment, character values of characters located before the updated A character are greater than or equal to the character value of the updated A character, and character values of characters located after the updated A character are greater than the character value of the updated A character.

In this embodiment of this application, if the service device determines, based on the third target character, that the data distribution characteristic of the first data segment is the non-plain distribution, the service device may determine a fifth data segment from the to-be-chunked data flow, and further determine, based on character values of all characters in the fifth data segment, whether the data distribution characteristic of the first data segment is basin distribution or even distribution. A first character in the fifth data segment is adjacent to the last character in the first data segment, a character length between an end position of the third target character and an end position of a last character in the fifth data segment is the second length, and the first character in the fifth data segment is a next character of the last character in the first data segment.

Specifically, a specific implementation in which the service device determines, based on the character values of all the characters in the fifth data segment, whether the data distribution characteristic of the first data segment is the basin distribution or the even distribution may be as follows: If the character values of all the characters in the fifth data segment are greater than the character value of the third target character, the service device may determine that the data distribution characteristic of the first data segment is the basin distribution, or if at least one character whose character value is less than or equal to the character value of the third target character exists in the fifth data segment, the service device may determine that the data distribution characteristic of the first data segment is the even distribution.

In an implementation, if the data distribution characteristic of the first data segment is the basin distribution, a specific implementation in which the service device determines the chunking position of the to-be-chunked data flow based on the second length may be as follows: determining the end position of the last character in the fifth data segment as the chunking position of the to-be-chunked data flow.

In an implementation, if the data distribution characteristic of the first data segment is the even distribution, for an execution process in which the service device determines the chunking position of the to-be-chunked data flow based on the second length, refer to specific descriptions of steps s6031 to s6033. Details are not described herein again.

Step S604: The service device uses characters between a start position of the first character in the first data segment and the chunking position as a data chunk.

It should be noted that, for a process of performing step S604, refer to specific descriptions of step S305 in FIG. 3a. Details are not described herein again.

In this embodiment of this application, after it is determined, based on the third target character, that the data distribution characteristic of the first data segment is the non-plain distribution, it may be further determined, based on the character values of all the characters in the fifth data segment, whether the data distribution characteristic of the first data segment is the basin distribution or the even distribution, and different chunking policies are further executed for different data distribution characteristics, to determine the chunking position. In this manner, the chunking method provided in this embodiment of this application can better adapt to a data flow that has different data distribution characteristics, and data chunks of different chunking lengths are output for different data distribution characteristics. In this way, a boundary offset problem can be effectively resolved, and the data flow can be better chunked, thereby enhancing a deduplication effect.

FIG. 7a-1, FIG. 7a-2, and FIG. 7a-3 are a schematic flowchart of still another chunking method according to an embodiment of this application. The method describes in detail a specific procedure of performing chunking processing on a to-be-chunked data flow. The method may include but is not limited to the following steps.

Step S701: A service device determines a first data segment of a first length starting from a header of a to-be-chunked data flow, where the first data segment includes a plurality of characters, and a character length of the plurality of characters included in the first data segment is the first length.

Step S702: If a second target character does not exist in the first data segment, the service device determines that a data distribution characteristic of the first data segment is plain distribution, or if a second target character exists in the first data segment, the service device determines that a data distribution characteristic of the first data segment is non-plain distribution, where character values of characters that are in the first data segment and that are located before the second target character are all less than a character value of the second target character, and character values of characters that are in the first data segment and that are located after the second target character are all less than or equal to the character value of the second target character.

Step S703: If the data distribution characteristic of the first data segment is the plain distribution, the service device determines a first target character from characters after a last character in the first data segment, and determines a start position of the first target character as a chunking position of the to-be-chunked data flow, where the first target character meets a chunking condition, and the chunking condition includes: a character value of the first target character is different from a character value of a first character in the first data segment, and a character length of a data segment for which the first character in the first data segment is used as a start character and a previous character of the first target character is used as an end character is greater than or equal to an expected chunking length.

It should be noted that for a process of performing step S701 to step S703, respectively refer to specific descriptions of step S501 to step S502 in FIG. 5a and step S403 in FIG. 4a. Details are not described herein again. In this embodiment of this application, after performing step S703, the service device may perform step S708 to obtain a data chunk. It should be further noted that, in step S702, the method described in step S202, step S302, or step S402 may be further used to determine that the data distribution characteristic of the first data segment is the plain distribution. Details are not described herein.

Step S704: If the data distribution characteristic of the first data segment is the non-plain distribution, the service device determines a second data segment from the to-be-chunked data flow, where if character values of all characters in the second data segment are less than the character value of the second target character, the service device determines that the data distribution characteristic of the first data segment is plateau distribution; or if at least one character whose character value is greater than or equal to the character value of the second target character exists in the second data segment, the service device determines that the data distribution characteristic of the first data segment is even distribution, where a first character in the second data segment is adjacent to a last character in the first data segment, a character length between an end position of the second target character and an end position of a last character in the second data segment is a second length, and the first character in the second data segment is a next character of the last character in the first data segment.

In this embodiment of this application, if it is determined, based on the second target character, that the data distribution characteristic of the first data segment is the non-plain distribution, the service device may determine the second data segment from the to-be-chunked data flow, further determine, based on the character values of all characters in the second data segment, whether the data distribution characteristic of the first data segment is the plateau distribution or the even distribution, and then use different chunking policies for the plateau distribution and the even distribution, to determine different chunking positions. In this way, the chunking method provided in this embodiment of this application can better adapt to a data flow that has different data distribution characteristics, and output data chunks with different chunking lengths for different data distribution characteristics. In this way, a boundary offset problem can be effectively resolved, and the data flow can be better chunked, thereby enhancing a deduplication effect.

Step S705: If the data distribution characteristic of the first data segment is the plateau distribution, the service device determines the end position of the last character in the second data segment as the chunking position of the to-be-chunked data flow.

Figure 7B:
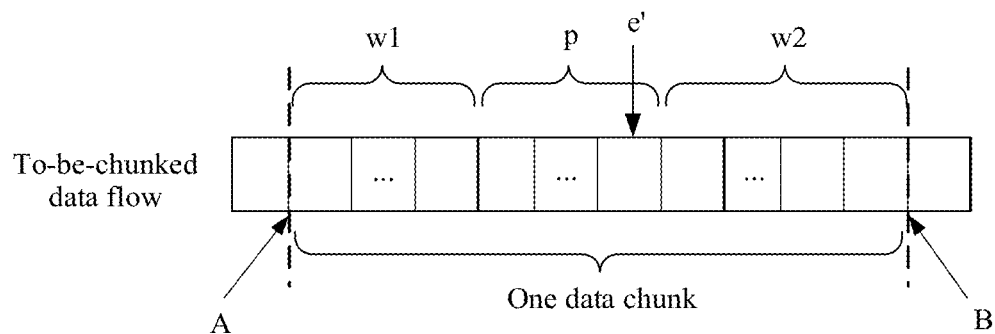
FIG. 7b is a schematic diagram of an operating principle of a chunking method according to an embodiment of this application.

In this embodiment of this application, FIG. 7b may be used to represent a schematic diagram of an operating principle of the chunking method disclosed in this embodiment of this application. e' is a character extremum in a range of w1+p+w2, a length of p is variable, and lengths of w1 and w2 are fixed. Character values of all characters in a range of w1+p are less than or equal to e' (or character values of all characters in a range of w1+p are greater than or equal to e'). All characters in the range of w1+p+w2 form a data chunk (that is, a current data chunk). A chunking position A of a previous data chunk is a start position of a first character in a range of w1, and a chunking position B of the current data chunk is an end position of a last character in a range of w2.

As shown in FIG. 7b, a probability that the character extremum e' is found in the range of w1+p+w2 is 1/(w1+p+w2). Therefore, $$\int_0^\infty \frac{1}{w1+p+w2} dp = 1,$$

and p=(w1+w2)(e−1) may be further obtained, where e=2.71. An expected chunking length E may be obtained through calculation according to a relational expression p=(w1+w2)(e−1).

$$E = \frac{1}{w1+1+w2}(w1+1+w2) + \ldots + \frac{1}{w1+p+w2}(w1+p+w2) =$$

$$(w1+w2)(e-1)$$

If an extremum factor α=w2/E, $$w1 = \frac{1-\alpha e + \alpha}{e-1}E$$

and w2=αE may be obtained through calculation according to α=w2/E and E=(w1+w2)(e−1). In other words, both the first length w1 and the second length w2 may be determined by the service device based on the expected chunking length E and the extremum factor α. A value range of the extremum factor α is (0, 1), and α may be set by the service device by default, or may be set by the service device based on a user operation. This is not limited in the embodiments of this application. The extremum factor α is a relative position of the character extremum e' in a data chunk.

In an implementation, any data chunk may be chunked into m small chunks, and a chunking length of each small chunk is w'=w1+w2. In a range of an $a^{th}$ small chunk $[(\alpha-1)w'+1, (a-1)w'+w']$, a probability that a character value of a $(a-1)w'+i^{th}$ character is greater than (or less than) character values of preceding characters is: $1/((a-1)w'+i)$, and a probability that all characters in the range do not meet the condition is:

$$\prod_{i=1}^{w'}\left(1 - \frac{1}{(a-1)w'+i}\right) = \frac{(a-1)w'}{(a-1)w'+w'} = \frac{a-1}{a}$$

Therefore, a probability that at least one character whose character value is greater than (or less than) all character values of the preceding characters exists in the range of [(a−1)w'+1, (a−1)w'+w'] is:

$$1 - \frac{a-1}{a} = \frac{1}{a}.$$

Therefore, a probability that at least one character whose character value is greater than (or less than) character values of preceding characters exists in any data chunk is 1/m!. In addition, because the expected chunking length is (e−1)w', an actual quantity of small chunks m' of any data chunk may be represented as:

$$m' = \frac{(e-1)w'm}{w'} = (e-1)m$$

Therefore, a probability that at least one character whose character value is greater than (or less than) character values of preceding characters exists any data chunk is $$P = \frac{1}{[(e-1)m]!}.$$

When m=2, P=9.38%, a probability that the chunking length is 2E is 9.38%. It can be learned that according to the chunking method disclosed in this embodiment of this application, lengths of data chunks can be mainly concentrated in a single expected chunking length E. In this way, a data flow can be better chunked, to enhance a deduplication effect.

It can be learned from FIG. 7b that, in the chunking method disclosed in this embodiment of this application, E=w1+p+w2, and in an AE algorithm, E=p+w. Because w1, w2, and w are all fixed values, and w1, w2, and w are all greater than 1, w2<w. In addition, when the data distribution characteristic of the first data segment is the plateau distribution, the service device may determine that the end position of the last character in the second data segment is the chunking position of the to-be-chunked data flow. In other words, after the second target character (namely, a character corresponding to the maximum value e') is found, the service device may determine an end position of the $w2^{nd}$ character after the second target character as the chunking position of the to-be-chunked data flow. In comparison with the AE algorithm in which after the maximum value e' is found, an end position of a $w^{th}$ character after the character corresponding to the maximum value e' is determined as the chunking position of the to-be-chunked data flow, by using the chunking method disclosed in this embodiment of this application, when the data distribution characteristic of the first data segment is the plateau distribution, a character length of an output data chunk is less than a character length of a data chunk that is output by using the AE algorithm. In this way, a next chunking period can be entered as soon as possible. This effectively reduces impact of the plateau distribution on a search process of the chunking position.

In this embodiment of this application, after performing step S705, the service device may perform step S708 to obtain the data chunk.

Step S706: If the data distribution characteristic of the first data segment is the even distribution, the service device determines a third data segment from the to-be-chunked data flow, where a first character in the third data segment is adjacent to the last character in the first data segment, a character value of a last character in the third data segment is greater than or equal to the character value of the second target character and is greater than or equal to a character value of another character in the third data segment, and the first character in the third data segment is a next character of the last character in the first data segment.

Step S707: The service device determines a fourth data segment from the to-be-chunked data flow, where a first character in the fourth data segment is adjacent to the last character in the third data segment, a character length of a plurality of characters in the fourth data segment is the second length, the first character in the fourth data segment is a next character of the last character in the third data segment, and if character values of all characters in the fourth data segment are less than the character value of the last character in the third data segment, the service device determines an end position of the last character in the fourth data segment as the chunking position of the to-be-chunked data flow.

Step S708: The service device uses characters between the start position of the first character in the first data segment and the chunking position as a data chunk.

It should be noted that for a process of performing steps S706 to S707, refer to specific descriptions of step S503 in FIG. 5a. For a process of performing step S708, refer to specific descriptions of step S305 in FIG. 3a. Details are not described herein again.

In this embodiment of this application, when the data distribution characteristic of the first data segment is the plain distribution, the start position of the first target character that meets the two chunking conditions is determined as the chunking position. On one hand, a length of the data chunk that is determined based on the chunking position may be greater than or equal to the expected chunking length, to avoid a case in which a length of a data chunk output by using the AE algorithm is less than a chunking expected length (namely, the expected chunking length) when the data distribution characteristic of the first data segment is the plain distribution. In this way, power consumption of calculating a hash value of the data chunk by the service device can be effectively reduced. On the other hand, more characters with a same character value may be chunked into a same data chunk as much as possible, to improve a deduplication rate and enhance a deduplication effect. In addition, when the data distribution characteristic of the first data segment is the non-plain distribution, the service device determines the second data segment from the to-be-chunked data flow, further determine, based on the character values of all characters in the second data segment, whether the data distribution characteristic of the first data segment is the plateau distribution or the even distribution, and then use different chunking policies for the plateau distribution and the even distribution, to determine different chunking positions. In this way, the chunking method provided in this embodiment of this application can better adapt to a data flow that has different data distribution characteristics, and output data chunks with different chunking lengths for different data distribution characteristics. In this way, a boundary offset problem can be effectively resolved, and the data flow can be better chunked, thereby enhancing a deduplication effect.

The foregoing describes in detail the methods in the embodiments of this application. The following provides apparatuses in the embodiments of this application.

Figure 8:
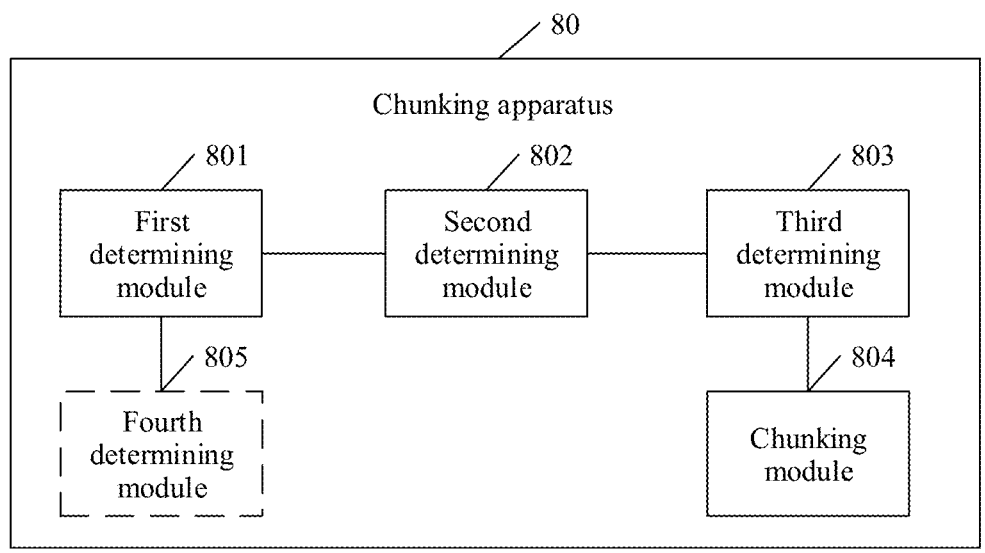
FIG. 8 is a schematic structural diagram of a chunking apparatus according to an embodiment of this application.

FIG. 8 is a schematic structural diagram of a chunking apparatus according to an embodiment of this application. The chunking apparatus 80 is configured to perform the steps performed by the service device in the method embodiments corresponding to FIG. 2 to FIG. 7*a*-1, FIG. 7*a*-2, and FIG. 7*a*-3. The chunking apparatus 80 may include:

a first determining module 801, configured to determine a first data segment of a first length starting from a header of a to-be-chunked data flow, where the first data segment includes a plurality of characters, and a character length of the plurality of characters included in the first data segment is the first length;

a second determining module 802, configured to determine a data distribution characteristic of the first data segment based on character values of the characters in the first data segment;

a third determining module 803, configured to determine a chunking position of the to-be-chunked data flow based on the data distribution characteristic of the first data segment; and a chunking module 804, configured to use characters between a start position of a first character in the first data segment and the chunking position as a data chunk.

In an implementation, the third determining module 803 may be specifically configured to: if the data distribution characteristic of the first data segment is plain distribution, determine the chunking position of the to-be-chunked data flow based on an expected chunking length, where character values of all characters in a data segment whose data distribution characteristic is the plain distribution are the same.

In an implementation, the second determining module 802 may be specifically configured to: if a character value of the first character in the first data segment is a maximum value in the character values of the characters in the first data segment, and the character value of the first character in the first data segment is equal to a character value of a last character in the first data segment, determine that the data distribution characteristic of the first data segment is plain distribution.

In an implementation, when the third determining module 803 is configured to determine the chunking position of the to-be-chunked data flow based on the expected chunking length, the third determining module 803 may be specifically configured to: determine a first target character from characters after the last character in the first data segment, and determine a start position of the first target character as the chunking position of the to-be-chunked data flow, where the first target character meets a chunking condition, and the chunking condition includes: a character value of the first target character is different from the character value of the first character in the first data segment, and a character length of a data segment for which the first character in the first data segment is used as a start character and a previous character of the first target character is used as an end character is greater than or equal to the expected chunking length.

In an implementation, when the third determining module 803 is configured to determine the chunking position of the to-be-chunked data flow based on the expected chunking length, the third determining module 803 may be specifically configured to determine a position as the chunking position of the to-be-chunked data flow, where a character length between the position and a start position of a first character in the first data segment is the expected chunking length.

In an implementation, the third determining module 803 may be specifically configured to: if the data distribution characteristic of the first data segment is non-plain distribution, determine the chunking position of the to-be-chunked data flow based on a second length, where the second length is less than the expected chunking length, and at least two characters whose character values are different exist in a data segment whose data distribution characteristic is the non-plain distribution.

In an implementation, the second determining module 802 may be specifically configured to: if a second target character exists in the first data segment, determine that the data distribution characteristic of the first data segment is non-plain distribution, where character values of characters that are in the first data segment and that are located before the second target character are all less than a character value of the second target character, and character values of characters that are in the first data segment and that are located after the second target character are all less than or equal to the character value of the second target character.

In an implementation, when the third determining module 803 is configured to determine the chunking position of the to-be-chunked data flow based on the second length, the third determining module 803 may be specifically configured to: determine a second data segment from the to-be-chunked data flow, and if character values of all characters in the second data segment are less than the character value of the second target character, determine the end position of the last character in the second data segment as the chunking position of the to-be-chunked data flow, where a first character in the second data segment is adjacent to the last character in the first data segment, and a character length between an end position of the second target character and the end position of the last character in the second data segment is the second length.

In an implementation, when the third determining module 803 is configured to determine the chunking position of the to-be-chunked data flow based on the second length, the third determining module 803 may be specifically configured to: determine a third data segment from the to-be-chunked data flow, where a first character in the third data segment is adjacent to the last character in the first data segment, a character value of a last character in the third data segment is greater than or equal to the character value of the second target character and is greater than or equal to a character value of another character in the third data segment; determine a fourth data segment from the to-be-chunked data flow, where a first character in the fourth data segment is adjacent to the last character in the third data segment, and a character length of a plurality of characters in the fourth data segment is the second length; and if character values of all characters in the fourth data segment are less than the character value of the last character in the third data segment, determine an end position of the last character in the fourth data segment as the chunking position of the to-be-chunked data flow.

In an implementation, the third determining module 803 may be further configured to: determine a second data segment from the to-be-chunked data flow, and if at least one character whose character value is greater than or equal to the character value of the second target character exists in the second data segment, trigger the step of determining a third data segment from the to-be-chunked data flow, where a first character in the second data segment is adjacent to a last character in the first data segment, and a character length between an end position of the second target character and an end position of a last character in the second data segment is the second length.

In an implementation, the chunking apparatus 80 may further include a fourth determining module 805, and the fourth determining module 805 may be configured to determine the first length and the second length based on the expected chunking length.

It should be noted that, for content that is not described in the embodiment corresponding to FIG. 8 and specific implementations of steps performed by modules, refer to the embodiments shown in FIG. 2 to FIG. 7*a*-1, FIG. 7*a*-2, and FIG. 7*a*-3 and the foregoing content. Details are not described herein.

Figure 9:
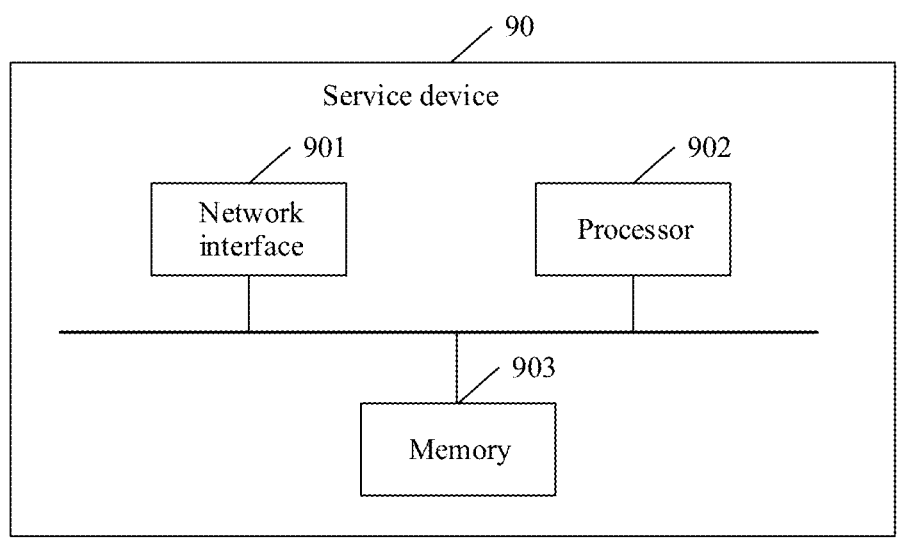
FIG. 9 is a schematic structural diagram of a service device according to an embodiment of this application.

In an implementation, related functions implemented by the modules in FIG. 8 may be implemented through a combination of a processor and a network interface. FIG. 9 is a schematic structural diagram of a service device according to an embodiment of this application. The service device 90 may include a network interface 901, a processor 902, and a memory 903. The network interface 901, the processor 902, and the memory 903 may be connected to each other through one or more communications buses, or may be connected in another manner. Related functions implemented by the first determining module 801, the second determining module 802, the third determining module 803, the chunking module 804, and the fourth determining module 805 shown in FIG. 8 may be implemented by using a same processor 902, or may be implemented by using a plurality of different processors 902.

The network interface 901 may be configured to send data and/or signaling, and receive data and/or signaling. In this embodiment of this application, the network interface 901 may be configured to receive a to-be-chunked data flow.

The processor 902 is configured to perform a corresponding function of the service device in the methods in FIG. 2 to FIG. 7*a*-1, FIG. 7*a*-2, and FIG. 7*a*-3. The processor 902 may include one or more processors. For example, the processor 902 may be one or more central processing units (central processing unit, CPU), a network processor (network processor, NP), a hardware chip, or any combination thereof. When the processor 902 includes one CPU, the CPU may be a single-core CPU, or may be a multi-core CPU.

The memory 903 is configured to store program code. The memory 903 may include a volatile memory (volatile memory), for example, a random access memory (random access memory, RAM). Alternatively, the memory 903 may include a non-volatile memory (non-volatile memory), for example, a read-only memory (read-only memory, ROM), a flash memory (flash memory), a hard disk drive (hard disk drive, HDD), or a solid-state drive (solid-state drive, SSD). Alternatively, the memory 903 may include a combination of the foregoing types of memories.

The processor 902 may invoke the program code stored in the memory 903, to perform the following operations:

determining a first data segment of a first length starting from a header of a to-be-chunked data flow, where the first data segment includes a plurality of characters, and a character length of the plurality of characters included in the first data segment is the first length;

determining a data distribution characteristic of the first data segment based on character values of all characters in the first data segment;

determining a chunking position of the to-be-chunked data flow based on the data distribution characteristic of the first data segment; and using characters between a start position of a first character in the first data segment and the chunking position as a data chunk.

In an implementation, when determining the chunking position of the to-be-chunked data flow based on the data distribution characteristic of the first data segment, the processor 902 may specifically perform the following operation: if the data distribution characteristic of the first data segment is plain distribution, determining the chunking position of the to-be-chunked data flow based on an expected chunking length, where character values of all characters in a data segment whose data distribution characteristic is the plain distribution are the same.

In an implementation, when determining the data distribution characteristic of the first data segment based on the character values of the characters in the first data segment, the processor 902 may specifically perform the following operation: if a character value of the first character in the first data segment is a maximum value in the character values of the characters in the first data segment, and the character value of the first character in the first data segment is equal to a character value of a last character in the first data segment, determining that the data distribution characteristic of the first data segment is plain distribution.

In an implementation, when determining the chunking position of the to-be-chunked data flow based on the expected chunking length, the processor 902 may specifically perform the following operation: determining a first target character from characters after the last character in the first data segment, and determining a start position of the first target character as the chunking position of the to-be-chunked data flow, where the first target character meets a chunking condition, and the chunking condition includes: a character value of the first target character is different from the character value of the first character in the first data segment, and a character length of a data segment for which the first character in the first data segment is used as a start character and a previous character of the first target character is used as an end character is greater than or equal to the expected chunking length.

In an implementation, when determining the chunking position of the to-be-chunked data flow based on the expected chunking length, the processor 902 may specifically perform the following operation: determining a position as the chunking position of the to-be-chunked data flow, where a character length between the position and a start position of a first character in the first data segment is the expected chunking length.

In an implementation, when determining the chunking position of the to-be-chunked data flow based on the data distribution characteristic of the first data segment, the processor 902 may specifically perform the following operation: if the data distribution characteristic of the first data segment is non-plain distribution, determining the chunking position of the to-be-chunked data flow based on a second length, where the second length is less than the expected chunking length, and at least two characters whose character values are different exist in a data segment whose data distribution characteristic is the non-plain distribution.

In an implementation, when determining the data distribution characteristic of the first data segment based on the character values of the characters in the first data segment, the processor 902 may specifically perform the following operation: if a second target character exists in the first data segment, determining that the data distribution characteristic of the first data segment is non-plain distribution, where character values of characters that are in the first data segment and that are located before the second target character are all less than a character value of the second target character, and character values of characters that are in the first data segment and that are located after the second target character are all less than or equal to the character value of the second target character.

In an implementation, when determining the chunking position of the to-be-chunked data flow based on the second length, the processor 902 may specifically perform the following operation: determining a second data segment from the to-be-chunked data flow, and if character values of all characters in the second data segment are less than the character value of the second target character, determining the end position of the last character in the second data segment as the chunking position of the to-be-chunked data flow, where a first character in the second data segment is adjacent to the last character in the first data segment, and a character length between an end position of the second target character and the end position of the last character in the second data segment is the second length.

In an implementation, when determining the chunking position of the to-be-chunked data flow based on the second length, the processor 902 may specifically perform the following operation: determining a third data segment from the to-be-chunked data flow, where a first character in the third data segment is adjacent to the last character in the first data segment, a character value of a last character in the third data segment is greater than or equal to the character value of the second target character and is greater than or equal to a character value of another character in the third data segment; determining a fourth data segment from the to-be-chunked data flow, where a first character in the fourth data segment is adjacent to the last character in the third data segment, and a character length of a plurality of characters in the fourth data segment is the second length; and if character values of all characters in the fourth data segment are less than the character value of the last character in the third data segment, determining an end position of the last character in the fourth data segment as the chunking position of the to-be-chunked data flow.

In an implementation, before determining the third data segment from the to-be-chunked data flow, the processor 902 may further perform the following operation: determining a second data segment from the to-be-chunked data flow, and if at least one character whose character value is greater than or equal to the character value of the second target character exists in the second data segment, triggering the step of determining a third data segment from the to-be-chunked data flow, where a first character in the second data segment is adjacent to a last character in the first data segment, and a character length between an end position of the second target character and an end position of a last character in the second data segment is the second length.

In an implementation, the processor 902 may further perform the following operation: determining the first length and the second length based on the expected chunking length.

Further, the processor 902 may further perform operations corresponding to the service device in the embodiments shown in FIG. 2 to FIG. 7a-1, FIG. 7a-2, and FIG. 7a-3. For details, refer to descriptions in the method embodiments. Details are not described herein again.

An embodiment of this application further provides a computer-readable storage medium, which may be configured to store computer software instructions used by the chunking apparatus in the embodiment shown in FIG. 8. The computer software instructions include a program designed for the service device in the foregoing embodiments.

The computer-readable storage medium includes but is not limited to a flash memory, a hard disk, and a solid-state drive.

An embodiment of this application further provides a computer program product. When the computer product is run by a computing device, the methods designed for the service device in the embodiments in FIG. 2 to FIG. 7a-1, FIG. 7a-2, and FIG. 7a-3 may be performed.

An embodiment of this application further provides a processor. The processor includes at least one circuit, configured to determine a first data segment of a first length starting from a header of a to-be-chunked data flow, determine a data distribution characteristic of the first data segment based on character values of characters in the first data segment, and determine a chunking position of the to-be-chunked data flow based on the data distribution characteristic of the first data segment. The processor further includes at least one circuit, configured to use characters between a start position of a first character in the first data segment and the chunking position as a data chunk. The processor may be a chip, and may execute instructions or a program designed for the service device in the foregoing embodiments.

An embodiment of this application further provides a chip system. The chip system includes a processor, and the processor is configured to implement the chunking methods designed for the service device in the embodiments in FIG. 2 to FIG. 7a-1, FIG. 7a-2, and FIG. 7a-3. In a feasible implementation, the chip system further includes a memory, and the memory is configured to store program instructions and data that are necessary for implementing functions of the service device. The chip system may include a chip, or may include a chip and another discrete component.

An embodiment of this application further provides a chip, including a processor and a memory. The memory is configured to store a computer program, the processor is configured to invoke the computer program from the memory and run the computer program, and the computer program is used to implement the methods in the foregoing method embodiments.

A person of ordinary skill in the art may be aware that, in combination with the examples described in the embodiments disclosed in this application, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

All or some of the foregoing embodiments may be implemented by using software, hardware, firmware, or any combination thereof in the foregoing embodiments. When software is used to implement the embodiments, the embodiments may be implemented completely or partially in a form of a computer program product. The computer program product includes one or more computer instructions. When the computer program instructions are loaded and executed on the computer, the procedures or the functions according to the embodiments of this application are all or partially generated. The computer may be a general-purpose computer, a special-purpose computer, a computer network, or another programmable apparatus. The computer instructions may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (Solid State Disk, SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A chunking method, wherein the method comprises:
   determining a first data segment comprising a plurality of characters, wherein a first length of the plurality of characters starts from a header of a to-be-chunked data flow;
   determining a data distribution characteristic of the first data segment based on character values of the plurality of characters in the first data segment;
   determining a chunking position of the to-be-chunked data flow based on the data distribution characteristic of the first data segment; and
   using the plurality of characters between a start position of a first character in the first data segment and the chunking position as a data chunk.

2. The method according to claim 1, wherein the determining the chunking position of the to-be-chunked data flow based on the data distribution characteristic of the first data segment comprises:
   determining the chunking position of the to-be-chunked data flow based on an expected chunking length when the data distribution characteristic of the first data segment is plain distribution, wherein the character values of all of the plurality characters in the first data segment whose data distribution characteristic is the plain distribution are the same.

3. The method according to claim 1, wherein the determining the chunking position of the to-be-chunked data flow based on the data distribution characteristic of the first data segment comprises:
   determining the chunking position of the to-be-chunked data flow based on a second length when the data distribution characteristic of the first data segment is non-plain distribution, wherein the second length is less than an expected chunking length, and at least two characters whose character values are different exist in the first data segment whose data distribution characteristic is the non-plain distribution.

4. The method according to claim 3, wherein the determining the data distribution characteristic of the first data segment based on character values of the characters in the first data segment comprises:

determining that the data distribution characteristic of the first data segment is the non-plain distribution when a second target character exists in the first data segment, wherein the character values of the plurality of characters that are in the first data segment and that are located before the second target character are all less than a character value of the second target character, and character values of the plurality of characters that are in the first data segment and that are located after the second target character are all less than or equal to the character value of the second target character.

5. The method according to claim 4, wherein the determining the chunking position of the to-be-chunked data flow based on the second length comprises:
determining a second data segment from the to-be-chunked data flow, wherein a first character in the second data segment is adjacent to a last character in the first data segment, and a character length between an end position of the second target character and an end position of a last character in the second data segment is the second length; and
determining the end position of the last character in the second data segment as the chunking position of the to-be-chunked data flow when the character values of all of the characters in the second data segment are less than the character value of the second target character.

6. The method according to claim 4, wherein the determining the chunking position of the to-be-chunked data flow based on the second length comprises:
determining a third data segment from the to-be-chunked data flow, wherein a first character in the third data segment is adjacent to a last character in the first data segment, and a character value of a last character in the third data segment is greater than or equal to the character value of the second target character and greater than or equal to a character value of another character in the third data segment;
determining a fourth data segment from the to-be-chunked data flow, wherein a first character in the fourth data segment is adjacent to the last character in the third data segment, and a character length of a plurality of characters in the fourth data segment is the second length; and
determining an end position of a last character in the fourth data segment as the chunking position of the to-be-chunked data flow when the character values of all of the characters in the fourth data segment are less than the character value of the last character in the fourth data segment.

7. The method according to claim 6, wherein before the determining the third data segment from the to-be-chunked data flow, the method further comprises:
determining the second data segment from the to-be-chunked data flow, wherein a first character in the second data segment is adjacent to a last character in the first data segment, and a character length between an end position of the second target character and an end position of a last character in the second data segment is the second length; and
triggering the step of determining the third data segment from the to-be-chunked data flow when at least one character whose character value is greater than or equal to the character value of the second target character exists in the second data segment.

8. The method according to claim 3, wherein the method further comprises:
determining the first length and the second length based on the expected chunking length.

9. A chunking apparatus, comprising:
at least one processor;
one or more memories coupled to the at least one processor and storing instructions for execution by the at least one processor, the instructions instruct the at least one processor to cause the apparatus to:
determine a first data segment comprising a plurality of characters, wherein a first length of the plurality of characters starts from a header of a to-be-chunked data flow;
determine a data distribution characteristic of the first data segment based on character values of the plurality of characters in the first data segment;
determine a chunking position of the to-be-chunked data flow based on the data distribution characteristic of the first data segment; and
use the plurality of characters between a start position of a first character in the first data segment and the chunking position as a data chunk.

10. The apparatus according to claim 9, wherein the apparatus is specifically caused to: determine the chunking position of the to-be-chunked data flow based on an expected chunking length when the data distribution characteristic of the first data segment is plain distribution, wherein character values of all of the plurality of characters in the first data segment whose data distribution characteristic is the plain distribution are the same.

11. The apparatus according to claim 10, wherein the apparatus is specifically caused to: determine that the data distribution characteristic of the first data segment is the plain distribution when a character value of the first character in the first data segment is a maximum value in the character values of the characters in the first data segment, and the character value of the first character in the first data segment is equal to a character value of a last character in the first data segment.

12. The apparatus according to claim 10, wherein when the apparatus is caused to determine the chunking position of the to-be-chunked data flow based on the expected chunking length, the apparatus is specifically caused to is specifically configured to:
determine a first target character from the plurality of characters after the last character in the first data segment, wherein the first target character meets a chunking condition, and the chunking condition comprises: a character value of the first target character is different from the character value of the first character in the first data segment, and a character length of a third data segment for which the first character in the first data segment is used as a start character and a previous character of the first target character is used as an end character is greater than or equal to the expected chunking length; and
determine a start position of the first target character as the chunking position of the to-be-chunked data flow.

13. The apparatus according to claim 10, wherein when the apparatus is caused to determine the chunking position of the to-be-chunked data flow based on the expected chunking length, the apparatus is specifically caused to:
determine a position as the chunking position of the to-be-chunked data flow, wherein a character length between the position and the start position of the first character in the first data segment is the expected chunking length.

14. The apparatus according to claim 9, wherein the apparatus is specifically caused to:
  determine the chunking position of the to-be-chunked data flow based on a second length when the data distribution characteristic of the first data segment is non-plain distribution, wherein the second length is less than an expected chunking length, and at least two characters whose character values are different exist in a data segment whose data distribution characteristic is the non-plain distribution are different.

15. The apparatus according to claim 14, wherein the apparatus is specifically caused to:
  determine that the data distribution characteristic of the first data segment is the non-plain distribution when a second target character exists in the first data segment, wherein character values of characters that are in the first data segment and that are located before the second target character are all less than a character value of the second target character, and character values of the plurality of characters that are in the first data segment and that are located after the second target character are all less than or equal to the character value of the second target character.

16. The apparatus according to claim 15, wherein when the apparatus is caused to determine the chunking position of the to-be-chunked data flow based on the second length, the apparatus is specifically caused to:
  determine a second data segment from the to-be-chunked data flow, wherein a first character in the second data segment is adjacent to a last character in the first data segment, and a character length between an end position of the second target character and an end position of a last character in the second data segment is the second length; and
  determine the end position of the last character in the second data segment as the chunking position of the to-be-chunked data flow when character values of all the plurality of characters in the second data segment are less than the character value of the second target character.

17. The apparatus according to claim 15, wherein when the apparatus is caused to determine the chunking position of the to-be-chunked data flow based on the second length, the apparatus is specifically caused to:
  determine a third data segment from the to-be-chunked data flow, wherein a first character in the third data segment is adjacent to a last character in the first data segment, and a character value of a last character in the third data segment is greater than or equal to the character value of the second target character and greater than or equal to a character value of another character in the third data segment;
  determine a fourth data segment from the to-be-chunked data flow, wherein a first character in the fourth data segment is adjacent to the last character in the third data segment, and a character length of a plurality of characters in the fourth data segment is the second length; and
  if character values of all the characters in the fourth data segment are less than the character value of the last character in the third data segment, determine an end position of a last character in the fourth data segment as the chunking position of the to-be-chunked data flow when character values of all the characters in the fourth data segment are less than the character value of the last character in the third data segment.

18. The apparatus according to claim 17, wherein the apparatus is further caused to: determine the second data segment from the to-be-chunked data flow; and trigger the step of determining a third data segment from the to-be-chunked data flow when at least one character whose character value is greater than or equal to the character value of the second target character exists in the second data segment, wherein a first character in the second data segment is adjacent to a last character in the first data segment, and a character length between an end position of the second target character and an end position of a last character in the second data segment is the second length.

19. The apparatus according to claim 14, wherein the apparatus is specifically caused to determine the first length and the second length based on the expected chunking length.

20. A network system comprising a chunking apparatus, wherein the chunking apparatus comprising:
  at least one processor;
  one or more memories coupled to the at least one processor and storing instructions for execution by the at least one processor, the instructions instruct the at least one processor to cause the apparatus to:
  determine a first data segment comprising a plurality of characters, wherein a first length of the plurality of characters starts from a header of a to-be-chunked data flow;
  determine a data distribution characteristic of the first data segment based on character values of the plurality of characters in the first data segment;
  determine a chunking position of the to-be-chunked data flow based on the data distribution characteristic of the first data segment; and
  use the plurality of characters between a start position of a first character in the first data segment and the chunking position as a data chunk.

* * * * *